United States Patent
Park et al.

(10) Patent No.: US 10,490,281 B2
(45) Date of Patent: Nov. 26, 2019

(54) MEMORY DEVICE, MEMORY PACKAGE INCLUDING THE SAME, AND MEMORY MODULE INCLUDING THE SAME

(71) Applicant: Samsung Electronics Co., Ltd., Suwon-si (KR)

(72) Inventors: Sungchul Park, Seoul (KR); Chankyung Kim, Hwaseong-si (KR); Soo-Ho Cha, Seoul (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/621,885

(22) Filed: Jun. 13, 2017

(65) Prior Publication Data
US 2018/0005697 A1 Jan. 4, 2018

(30) Foreign Application Priority Data
Jun. 29, 2016 (KR) .................. 10-2016-0081652

(51) Int. Cl.
*G11C 16/10* (2006.01)
*G11C 7/06* (2006.01)

(52) U.S. Cl.
CPC ............... *G11C 16/10* (2013.01); *G11C 7/06* (2013.01); *H01L 2224/48145* (2013.01)

(58) Field of Classification Search
CPC ................................. G11C 16/10; G11C 7/06
USPC ............................................ 711/105; 710/23
See application file for complete search history.

(56) References Cited

U.S. PATENT DOCUMENTS

| | | | | |
|---|---|---|---|---|
| 5,442,282 | A * | 8/1995 | Rostoker | G01R 31/2856 324/73.1 |
| 5,544,351 | A * | 8/1996 | Lee | G06F 13/1689 711/211 |
| 5,845,314 | A * | 12/1998 | Ishida | G06F 5/10 711/104 |
| 6,862,653 | B1 * | 3/2005 | Dodd | G06F 13/1673 365/230.08 |
| 7,200,021 | B2 | 4/2007 | Raghuram | |
| 7,224,595 | B2 * | 5/2007 | Dreps | G11C 5/04 361/728 |
| 7,395,476 | B2 * | 7/2008 | Cowell | G11C 5/00 365/201 |
| 7,533,212 | B1 * | 5/2009 | Doblar | G06F 13/426 365/230.03 |
| 7,590,796 | B2 | 9/2009 | Rajan et al. | |

(Continued)

*Primary Examiner* — Paul R. Myers
(74) *Attorney, Agent, or Firm* — Muir Patent Law, PLLC

(57) ABSTRACT

Disclosed are a memory device, a memory package including the same, and a memory module including the same. The memory package includes a first memory device configured to operate in response to a first chip select signal from an external device, a second memory device configured to operate in response to a second chip select signal from the external device, and a third memory device configured to operate in response to a third chip select signal from the external device. The third memory device includes a buffer unit that is connected with an internal circuit of the third memory device through an internal data line, is connected with the first memory device through a first memory data line, is connected with the second memory device through a second memory data line, and is connected with the external device through a data line.

18 Claims, 18 Drawing Sheets

(56) References Cited

U.S. PATENT DOCUMENTS

| | | | |
|---|---|---|---|
| 7,599,205 B2 | 10/2009 | Rajan | |
| 7,609,567 B2 | 10/2009 | Rajan et al. | |
| 8,094,504 B2 | 1/2012 | Smolka | |
| 8,209,479 B2* | 6/2012 | Rajan | G06F 1/3203 711/105 |
| 8,539,145 B1* | 9/2013 | Warnes | G06F 13/1684 711/105 |
| 8,631,193 B2* | 1/2014 | Smith | G06F 13/4239 365/189.12 |
| 8,648,339 B2 | 2/2014 | Koyama et al. | |
| 8,737,108 B2* | 5/2014 | Saraswat | G11C 7/10 365/51 |
| 9,059,163 B2 | 6/2015 | Shapiro et al. | |
| 9,093,129 B2 | 7/2015 | Zhang | |
| 9,336,857 B2* | 5/2016 | Park | G11C 11/4093 |
| 9,443,561 B1* | 9/2016 | Roberts | G11C 5/02 |
| RE46,754 E * | 3/2018 | Goller | |
| 2002/0147898 A1* | 10/2002 | Rentschler | G06F 12/04 711/170 |
| 2005/0099834 A1* | 5/2005 | Funaba | G11C 5/04 365/63 |
| 2006/0039205 A1* | 2/2006 | Cornelius | G06F 13/1673 365/189.05 |
| 2006/0129755 A1* | 6/2006 | Raghuram | G11C 5/04 711/105 |
| 2006/0184844 A1* | 8/2006 | Sakamaki | G06F 13/1689 714/701 |
| 2007/0058410 A1* | 3/2007 | Rajan | G11C 5/02 365/63 |
| 2007/0101086 A1* | 5/2007 | Ferraiolo | G06F 13/1689 711/167 |
| 2008/0209112 A1* | 8/2008 | Yu | G06F 12/0246 711/103 |
| 2009/0037652 A1* | 2/2009 | Yu | G06F 12/0246 711/103 |
| 2009/0237971 A1* | 9/2009 | Chung | G11C 5/02 365/51 |
| 2009/0319703 A1* | 12/2009 | Chung | G11C 5/02 710/52 |
| 2010/0001758 A1* | 1/2010 | Dreps | G06F 13/4072 326/30 |
| 2010/0020583 A1* | 1/2010 | Kang | G11C 5/02 365/51 |
| 2011/0022931 A1* | 1/2011 | Eleftheriou | G06F 11/1068 714/763 |
| 2011/0292708 A1* | 12/2011 | Kang | H01L 23/481 365/63 |
| 2011/0299348 A1* | 12/2011 | Park | G11C 7/1051 365/193 |
| 2013/0103889 A1* | 4/2013 | Jeong | G06F 12/0246 711/103 |
| 2013/0119542 A1 | 5/2013 | Oh | |
| 2013/0132661 A1 | 5/2013 | Schakel et al. | |
| 2013/0138912 A1* | 5/2013 | Bux | G06F 12/0646 711/170 |
| 2013/0229848 A1* | 9/2013 | Vogelsang | G11C 5/025 365/63 |
| 2013/0336082 A1* | 12/2013 | Khawshe | G11C 5/005 365/233.12 |
| 2015/0255446 A1 | 9/2015 | Onodera et al. | |
| 2016/0064365 A1 | 3/2016 | Jang et al. | |
| 2017/0062029 A1* | 3/2017 | Song | G11C 7/222 |
| 2017/0185473 A1* | 6/2017 | Das | G06F 11/0793 |

* cited by examiner

MEMORY DEVICE, MEMORY PACKAGE INCLUDING THE SAME, AND MEMORY MODULE INCLUDING THE SAME

CROSS-REFERENCE TO RELATED APPLICATIONS

This application claims priority under 35 U.S.C. § 119 to Korean Patent Application No. 10-2016-0081652 filed Jun. 29, 2016, in the Korean Intellectual Property Office, the entire contents of which are hereby incorporated by reference.

BACKGROUND

Embodiments of the present disclosure relate to a semiconductor memory device, and more particularly, to a memory device, a memory package including the same, and a memory module including the same.

A semiconductor memory device refers to a memory device that is implemented using semiconductor such as silicon (Si), germanium (Ge), gallium arsenide (GaAs), indium phosphide (InP), or the like. Semiconductor memory devices are roughly divided into a volatile memory device and a nonvolatile memory device.

A volatile memory device refers to a memory device that loses data stored therein at power-off. A volatile memory device includes a static random access memory (SRAM), a dynamic random access memory (DRAM), a synchronous DRAM (SDRAM), or the like. A nonvolatile memory device refers to a memory device that retains data stored therein even at power-off. A nonvolatile memory device includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), or the like.

Since the DRAM has a fast operating speed, the DRAM is widely used as a main memory or a system memory of a user system such as a computer or a mobile system. Nowadays, there are needs for DRAM modules of an improved speed and an increased capacity as the performance of user systems become higher. A plurality of DRAM devices may be integrated to increase a storage capacity of a DRAM device. However, in the case where a plurality of DRAM devices are driven simultaneously or together, the load of a channel, through which a processor is connected to the DRAMs, may increase, thereby causing a decrease in a speed at which data is transmitted and received.

SUMMARY

Embodiments of the present disclosure provide a memory device with an increased storage capacity and an improved performance, a memory package including the same, and a memory module including the same.

According to an aspect of an embodiment, a memory package includes a first memory device configured to operate in response to a first chip select signal from an external device, a second memory device configured to operate in response to a second chip select signal from the external device, and a third memory device configured to operate in response to a third chip select signal from the external device. The third memory device includes a buffer unit that is connected with an internal circuit in the third memory device through an internal data line, is connected with the first memory device through a first memory data line, is connected with the second memory device through a second memory data line, and is connected with the external device through a data line.

According to another aspect of an embodiment, a memory module includes a first memory package including a first memory device configured to operate in response to a first chip select signal and a second memory device configured to operate in response to a second chip select signal, a second memory package including a third memory device configured to operate in response to the first chip select signal and a fourth memory device configured to operate in response to the second chip select signal, and a module driver that receives a command/address from an external device and provides the received command/address to the first and second memory packages. The first memory device includes a first buffer unit that is connected with the external device through a first data line, is connected with the second memory device through a first memory data line, and is connected with a first internal circuit in the first memory device through a first internal data line. The third memory device includes a second buffer unit that is connected with the external device through a second data line, is connected with the fourth memory device through a second memory data line, and is connected with a third internal circuit in the third memory device through a second internal data line.

According to another aspect of an embodiment, a memory device includes a memory cell array including a plurality of memory cells, a row decoder connected with the memory cell array through word lines and configured to select one of the word lines corresponding to an address from an external module driver and to control the selected word line, a column decoder connected with the memory cell array through bit lines and configured to select some of the bit lines corresponding to the address from the external module driver, a sense amplifier and write driver configured to sense voltages of the selected bit lines and to control voltages of the selected bit lines, an input/output circuit configured to exchange data with the sense amplifier and write driver, and a buffer unit connected with an external device through a data line, connected with a plurality of external memory devices through memory data lines, and connected with the input/output circuit through an internal data line.

According to still another aspect of an embodiment, a memory device includes a first memory including a first memory cell array and a first buffer circuit configured to sequentially output first and second data from the first memory cell array through a first data line, a second memory including a second memory cell array and a second buffer circuit configured to sequentially output third and fourth data from the second memory cell array through a second data line. The first buffer circuit may be connected to the second data line such that the first buffer circuit is configured to sequentially output the first through fourth data through the first data line.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, embodiments of the inventive concept may be described in detail and clearly to such an extent that an ordinary one in the art easily implements the inventive concept.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

Figure 1:
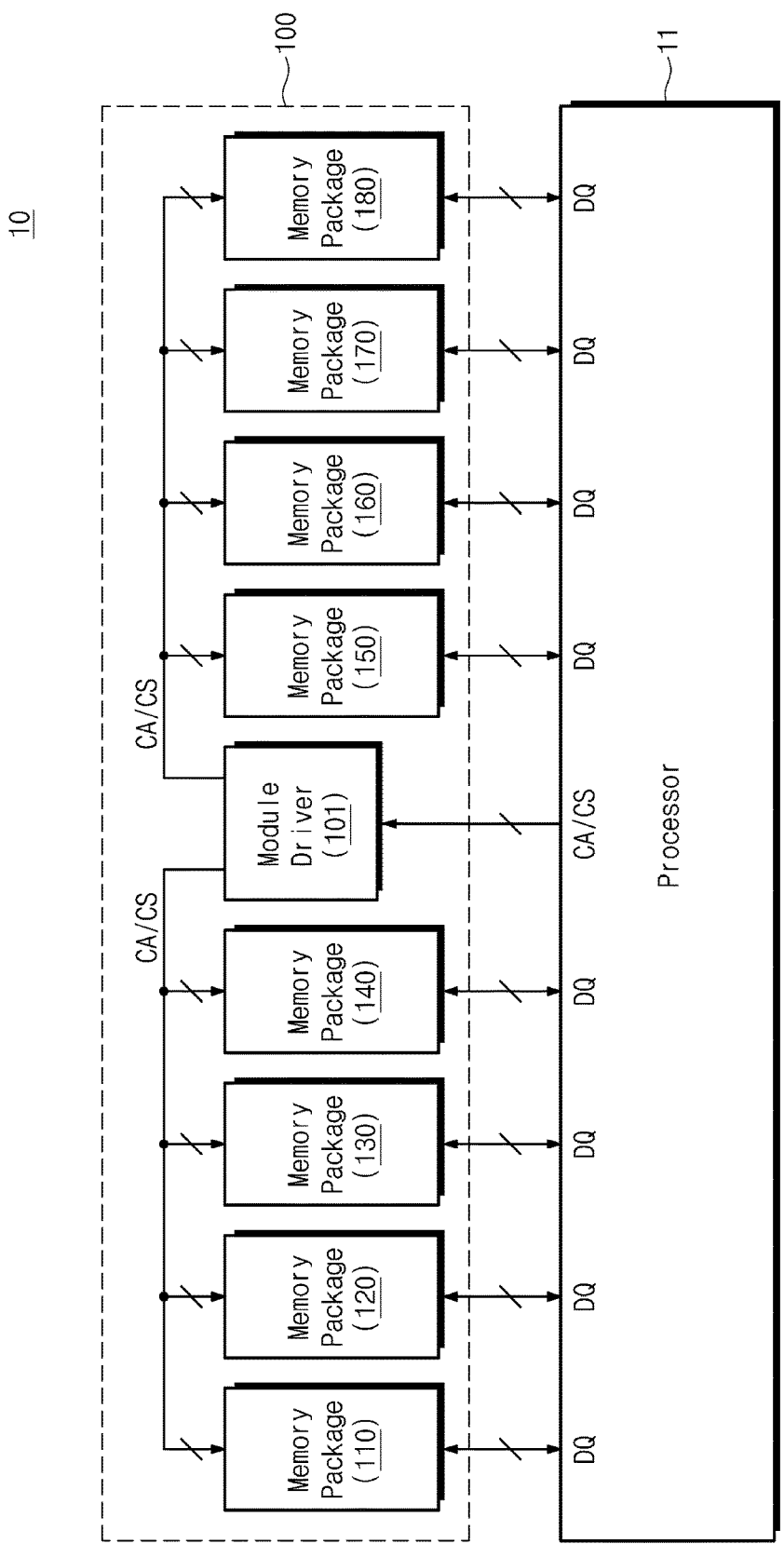
FIG. 1 is a block diagram illustrating a user system according to example embodiments.

FIG. 1 is a block diagram illustrating a user system according to example embodiments. Referring to FIG. 1, a user system 10 may include a processor 11 and a memory module 100. The processor 11 may store data in the memory module 100 or may read data stored in the memory module 100.

As used herein, a memory device may refer, for example, to a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

A user system, as used herein, may refer to one of these devices and may also include products that include these devices, such as a memory card, a memory module, a hard drive including additional components, a mobile phone, laptop, tablet, desktop, camera, server, computing system, or other consumer electronic device, etc.

The memory module 100 may be provided in the form factor such as a dual in-line memory module (DIMM). In an embodiment, the memory module 100 may further include other components, such as memory packages or serial presence detect (SPD), as well as components illustrated in FIG. 1. In an embodiment, the memory module 100 may be used as a buffer memory, a main memory, a working memory, or a cache memory of the user system 10 or the processor 11.

The memory module 100 may include a plurality of memory packages 110 to 180 and a module driver 101. The module driver 101 may receive a command/address CA and a chip select signal CS from the processor 11 and may provide the received signals to each of the memory packages 110 to 180. For example, the module driver 101 may supply the command/address CA and the chip select signal CS from the processor 11 to memory package groups (e.g., two memory package groups). That is, the command/address CA and the chip select signal CS may be supplied to a first memory package group (e.g., memory packages 110~140) and a second memory package group (e.g., memory packages 150~180) to which the command/address CA and the chip select signal CS are applied in common. In an embodiment, the module driver 101 may be a registered clock driver (RCD).

Each of the memory packages 110 to 180 may be connected with the processor 11 through respective data lines DQ and may exchange data with the processor 11 in response to a signal from the module driver 101. In an embodiment, each of the memory packages 110 to 180 may include a plurality of memory devices. Below, for ease of description, it is assumed that each of the memory packages 110 to 180 includes DRAM devices, however, embodiments are not limited thereto. For example, each of the memory devices may include a volatile memory, such as a static RAM (SRAM), a DRAM, or a synchronous DRAM (SDRAM), or a nonvolatile memory, such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), or a thyristor RAM (TRAM).

Figure 2A:
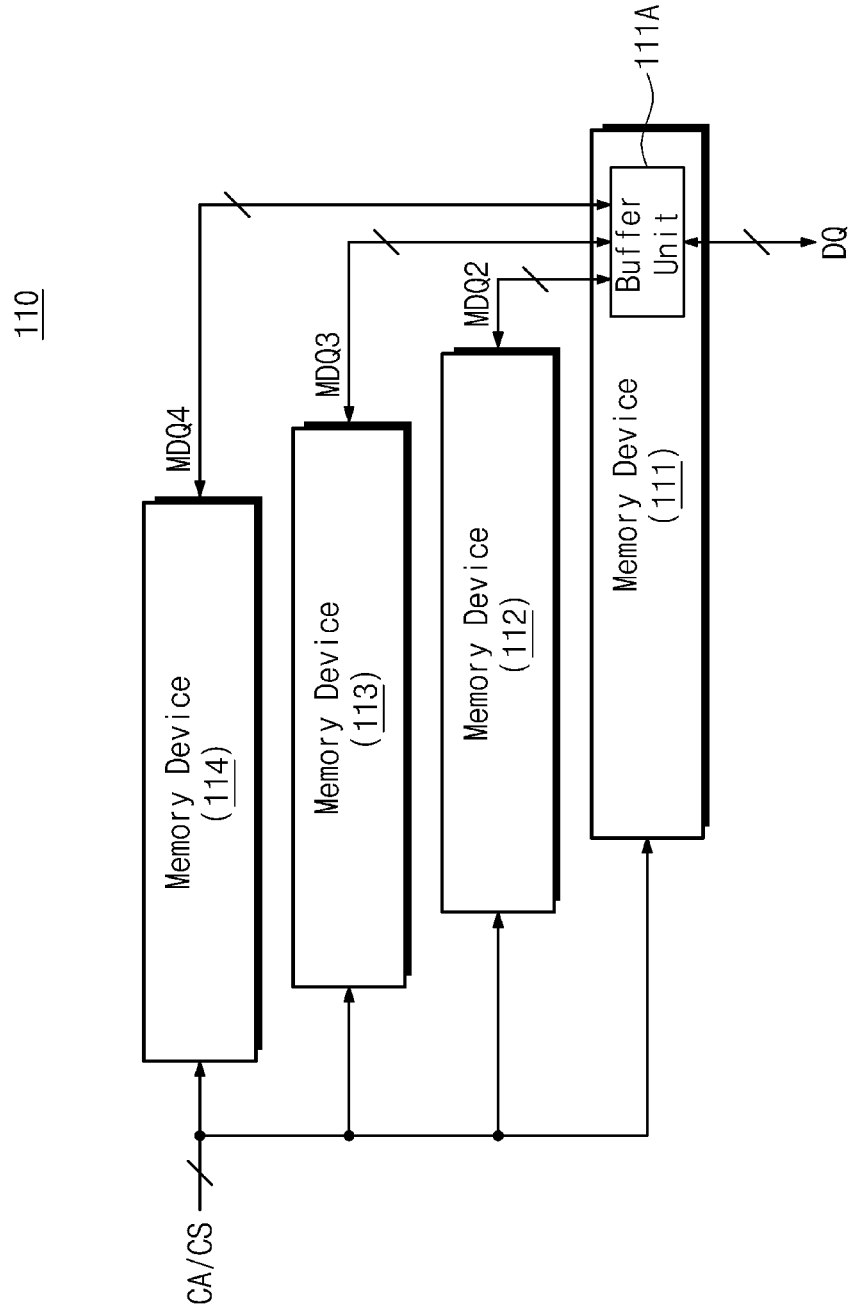
FIG. 2A is a block diagram illustrating one of a plurality of memory packages of FIG. 1 according to example embodiments.

FIG. 2A is a block diagram illustrating one of the memory packages of FIG. 1 according to example embodiments. For ease of illustration and for convenience of description, one memory package is illustrated in FIG. 2A. However, each of other memory packages of FIG. 1 may also include a structure similar to that of the memory package 110 of FIG. 2A.

Below, terms, such as a module, a unit, a function block, may be provided in the form of hardware or software. The software may be a machine code, firmware, an embedded code, and application software. The hardware may include, for example, an electrical circuit, an electronic circuit, a processor, a computer, an integrated circuit, integrated circuit cores, a pressure sensor, an inertial sensor, a microelectromechanical system (MEMS), a passive element, a logic element, or a combination thereof.

Referring to FIGS. 1 and 2A, the memory package 110 may include a plurality of memory devices 111 to 114. In the following embodiments, for ease of illustration and for ease of description, it is assumed that one memory package includes four memory devices 111 to 114. In an embodiment, although not illustrated in FIGS. 1 and 2A, the memory package 110 may further include other memory devices and may further include other functional components.

Each of the memory devices 111 to 114 may be implemented with a separate semiconductor die or a semiconductor chip. Each of the memory devices 111 to 114 may be configured to receive the command/address CA from the module driver 101. In example embodiments, the memory devices 111 to 114 may receive a common chip select signal CS or respectively receive first to fourth chip select signals CS1 to CS4 from the module driver 101. When the memory devices 111 to 114 receive the common chip select signal CS from the module driver 101, the memory devices 111 to 114 may be simultaneously activated in response to the common chip select signal CS. Alternatively, when the memory devices 111 to 114 respectively receive the first to fourth chip select signals CS1 to CS4 from the module driver 101, the memory devices 111 to 114 may be respectively activated in response to the first to fourth chip select signals CS1 to CS4.

In an embodiment, the memory devices 111 to 114 may be stacked in a direction perpendicular to a substrate (not illustrated) of the memory package 110. The memory devices 111 to 114 stacked in the direction perpendicular to the substrate of the memory package 110 may be connected to each other through substrate vias (e.g., through silicon vias) TSVs or bonding wires.

For example, a first memory device 111, which is adjacent to the substrate (i.e., arranged closest to the substrate), from among the memory devices 111 to 114 may include a buffer unit 111A. The buffer unit 111A may exchange data with an external device (e.g., the processor 11) through the data line DQ. The buffer unit 111A may be connected with the memory devices 112 to 114 through respective memory data lines MDQ2 to MDQ4, and may exchange data through the memory data lines MDQ2 to MDQ4. For example, the buffer unit 111A may be connected with a second memory device 112 through a second memory data line MDQ2, may be connected with a third memory device 113 through a third memory data line MDQ3, and may be connected with a fourth memory device 114 through a fourth memory data line MDQ4. In an embodiment, the buffer unit 111A may exchange data with the first memory device 111 (i.e., a memory device including the buffer unit 111A) through an internal data line IDQ (refer to FIG. 3). In an embodiment, each of the memory data lines MDQ2 to MDQ4 may include a plurality of signal lines each formed of the TSV or bonding wire. In an embodiment, the buffer unit 111A may be connected with an internal circuit of the first memory device 111. The internal circuit of the first memory device 111 may be a component such as an input/output circuit, a sense amplifier, a write driver, and so on.

The buffer unit 111A may provide a multiplexing (muxing) or demultiplexing (demuxing) function on data between the memory devices 111 to 114 and the processor 11. For example, the buffer unit 111A may select at least one of the memory devices 111 to 114 at a specific time and may provide data from the selected memory device to the processor 11 through the data line DQ and then the buffer unit 111A may sequentially provide data from the memory devices 111 to 114 to the processor 11 through the data line DQ. Alternatively, the buffer unit 111A may provide at least one of the memory devices 111 to 114 at a specific time with data sequentially received from the processor 11 through the data line DQ and then the buffer unit 111A may provide the received data to the memory devices 111 to 114.

As described above, the memory package 110 includes the memory devices 111 to 114, and at least one memory device 111 of the memory devices 111 to 114 includes the buffer unit 111A situated between the processor 11 and the memory devices 111 to 114. Since the buffer unit 111A is situated between the processor 11 and the memory devices 111 to 114, as compared to the case that the buffer unit 111A is absent, the load of a channel, through which the processor 11 is connected to the memory module 100, may be reduced, thereby improving a data transfer rate.

In example embodiments, although not illustrated in FIG. 2A, each of the memory devices 112 to 114 may include a buffer unit the same as or similar to the buffer unit 111A. For example, the memory device 112 may include a buffer unit 112A, the memory device 113 may include a buffer unit 113A, and the memory device 114 may include a buffer unit 114A. The buffer unit 112A may be connected to memory data line MDQ2, the buffer unit 113A may be connected to the memory data line MDQ3, and buffer unit 114A may be connected to the memory data line MDQ4.

In example embodiments, the buffer units 111A to 114A may be controlled by a command or a control signal from the module driver 101.

In a case where the buffer unit 111A is absent, the data line DQ connected with the processor 11 may be directly connected with the memory devices 111 to 114. In this case, the load of a channel, through which the processor 11 is connected to the memory devices 111 to 114, may increase, and thus the data transfer rate may be reduced. However, as described above, since the buffer unit 111A is present between the processor 11 and the memory devices 111 to 114, the load of a channel, through which the processor 11 is connected to the memory module 100, may be reduced, thereby improving the data transfer rate. In addition, since the memory devices 111 to 114 are included in one memory package 110, the storage capacity of the memory package 110 or the memory module 100 may increase in a state where the same performance is maintained.

Figure 2B:
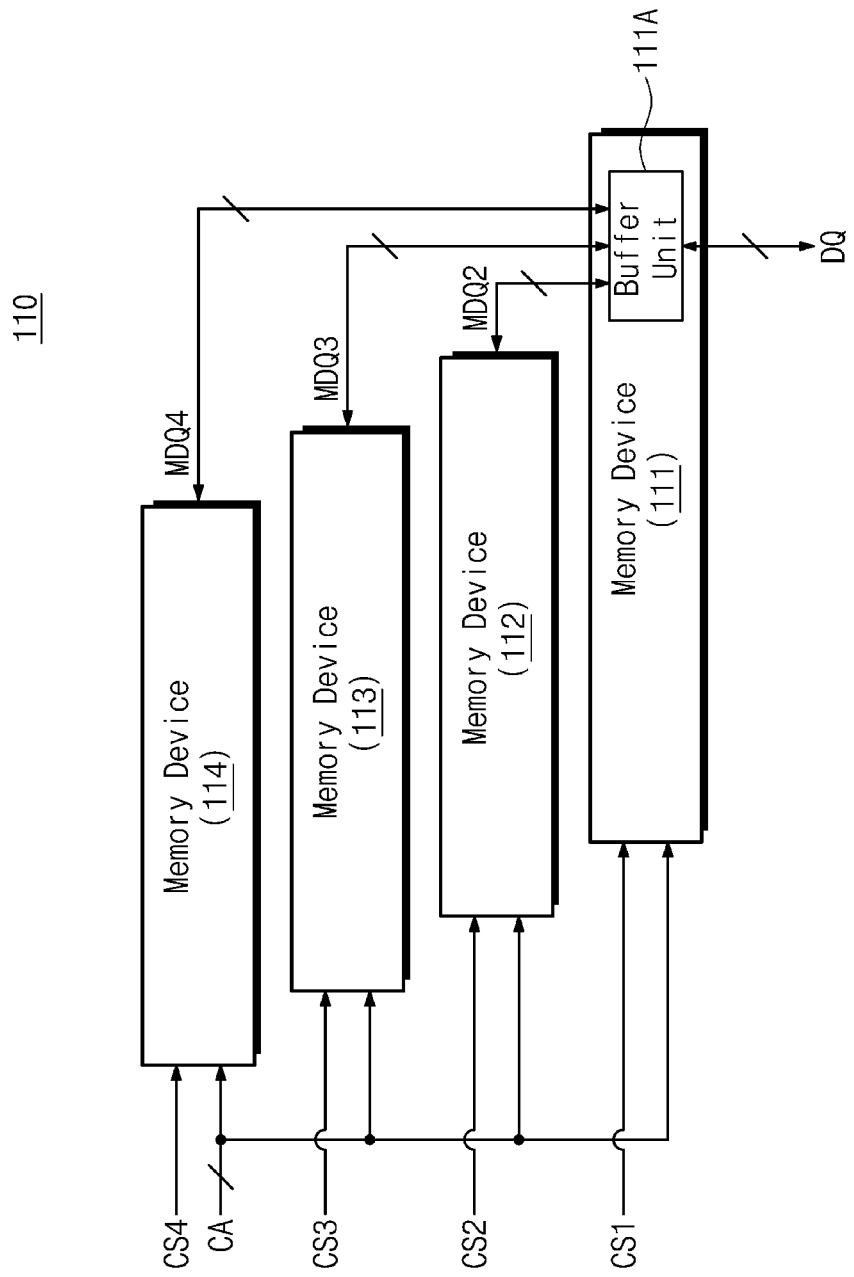
FIG. 2B is a block diagram illustrating one of a plurality of memory packages of FIG. 1 according to other example embodiments.

FIG. 2B is a block diagram illustrating one of the memory packages (e.g., a memory package 110) of FIG. 1 according to other example embodiments. For ease of illustration and for convenience of description, one memory package is illustrated in FIG. 2B. However, each of other memory packages of FIG. 1 may also include a structure similar to that of the memory package 110 of FIG. 2B. In example embodiments, detailed descriptions of the same contents as those of the above-described embodiments in FIG. 2A may be omitted.

Referring to FIGS. 1 and 2B, the memory devices 111 to 114 may respectively receive first to fourth chip select signals CS1 to CS4 from the module driver 101. In example embodiments, detailed descriptions of the same contents as those of the above-described embodiments of FIG. 2A will be omitted.

The memory devices 111 to 114 may be respectively activated in response to the first to fourth chip select signals CS1 to CS4. For example, the first memory device 111 may be activated in response to the first chip select signal CS1, the second memory device 112 may be activated in response to the second chip select signal CS2, the third memory device 113 may be activated in response to the third chip select signal CS3, and the fourth memory device 114 may be activated in response to the fourth chip select signal CS4.

Figure 3:
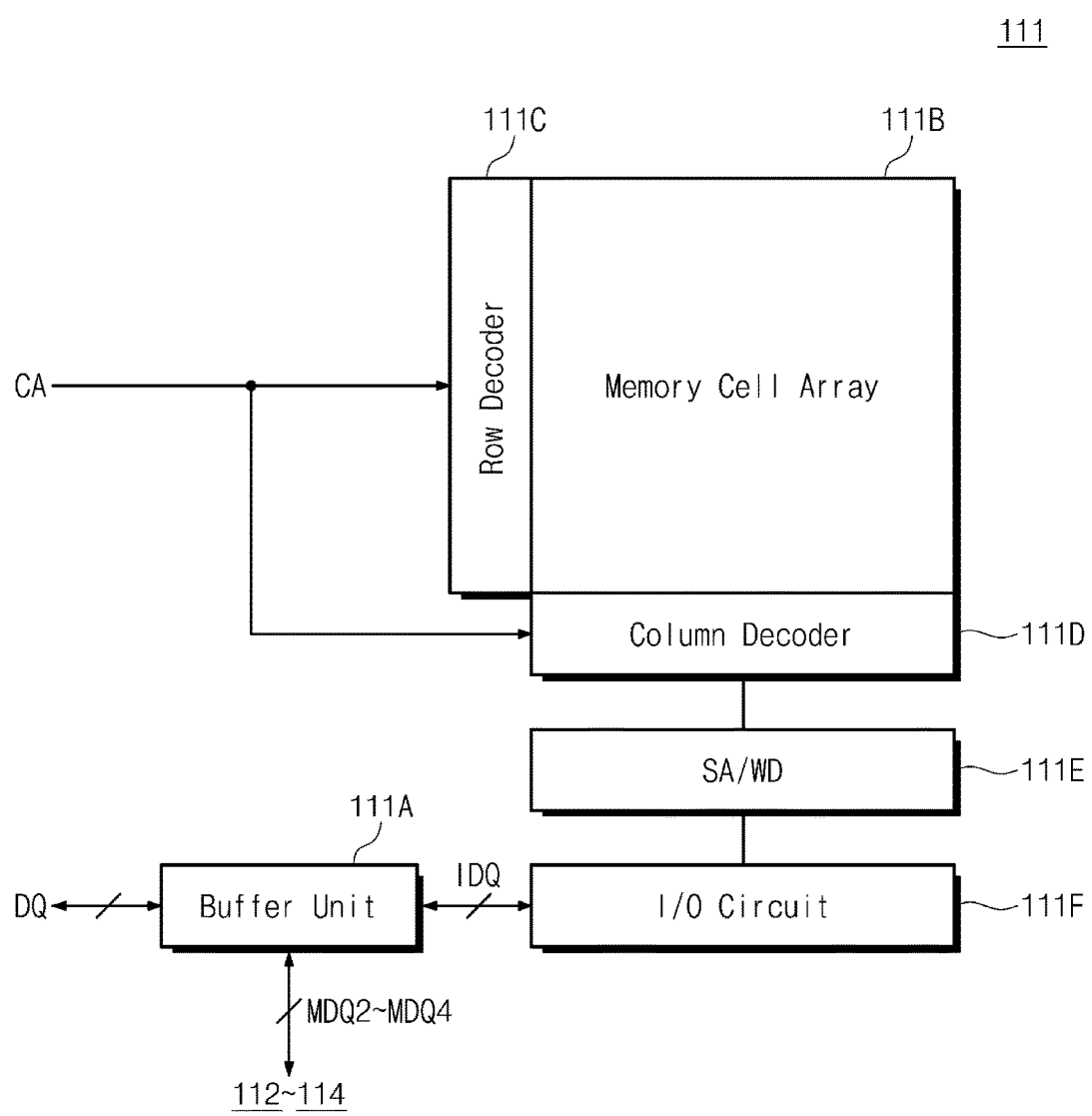
FIG. 3 is a block diagram illustrating a memory device including the buffer unit of FIGS. 2A and 2B according to example embodiments.

FIG. 3 is a block diagram illustrating a memory device including the buffer unit of FIGS. 2A and 2B according to example embodiments. For ease of illustration and for convenience of description, some of components of the memory device 111 are illustrated in FIG. 3. However, embodiments are not limited thereto. For example, the memory device 111 may further include other components.

Referring to FIGS. 1, 2A, 2B, and 3, the memory device 111 may include the buffer unit 111A, a memory cell array 111B, a row decoder 111C, a column decoder 111D, a sense amplifier/write driver 111E, and an input/output circuit 111F.

The buffer unit 111A may exchange data with the processor 11 through the data line DQ. The buffer unit 111A may exchange data with the memory devices 112 to 114 through the memory data lines MDQ2 to MDQ4. The buffer unit 111A may exchange data with the input/output circuit 111F through the internal data line IDQ.

In an exemplary embodiment, the buffer unit 111A may perform the above-described multiplexing/demultiplexing operation in response to a control signal (e.g., a chip select signal or a command signal) from the module driver 101.

The memory cell array 111B may include a plurality of memory cells. The memory cells may be connected with word lines (not illustrated) and bit lines (not illustrated). Each of the memory cells may be a DRAM memory cell that includes a storage capacitor and a transmission transistor.

The row decoder 111C may control voltages of the word lines in response to the command/address CA from the module driver 101. For example, in response to the command/address CA (in particular, a row address), the row decoder 111C may select at least one of the word lines and may control a voltage of the selected word line. The column decoder 111D may select at least one of the bit lines in response to the command/address CA (in particular, a column address) from the module driver 101. The sense amplifier/write driver 111E may sense or control voltages of bit lines selected by the column decoder 111D.

The input/output circuit 111F may provide data received from the buffer unit 111A to the sense amplifier/write driver 111E through the internal data line IDQ or may provide data received from the sense amplifier/write driver 111E to the buffer unit 111A through the internal data line IDQ. In an embodiment, the input/output circuit 111F may exchange data with the buffer unit 111A through the internal data line IDQ in synchronization with a data strobe signal DQS (not illustrated). In example embodiments, the data strobe signal DQS may include a read data strobe signal RDQS for a read operation and a write data strobe signal WDQS for a write operation.

Figure 4:
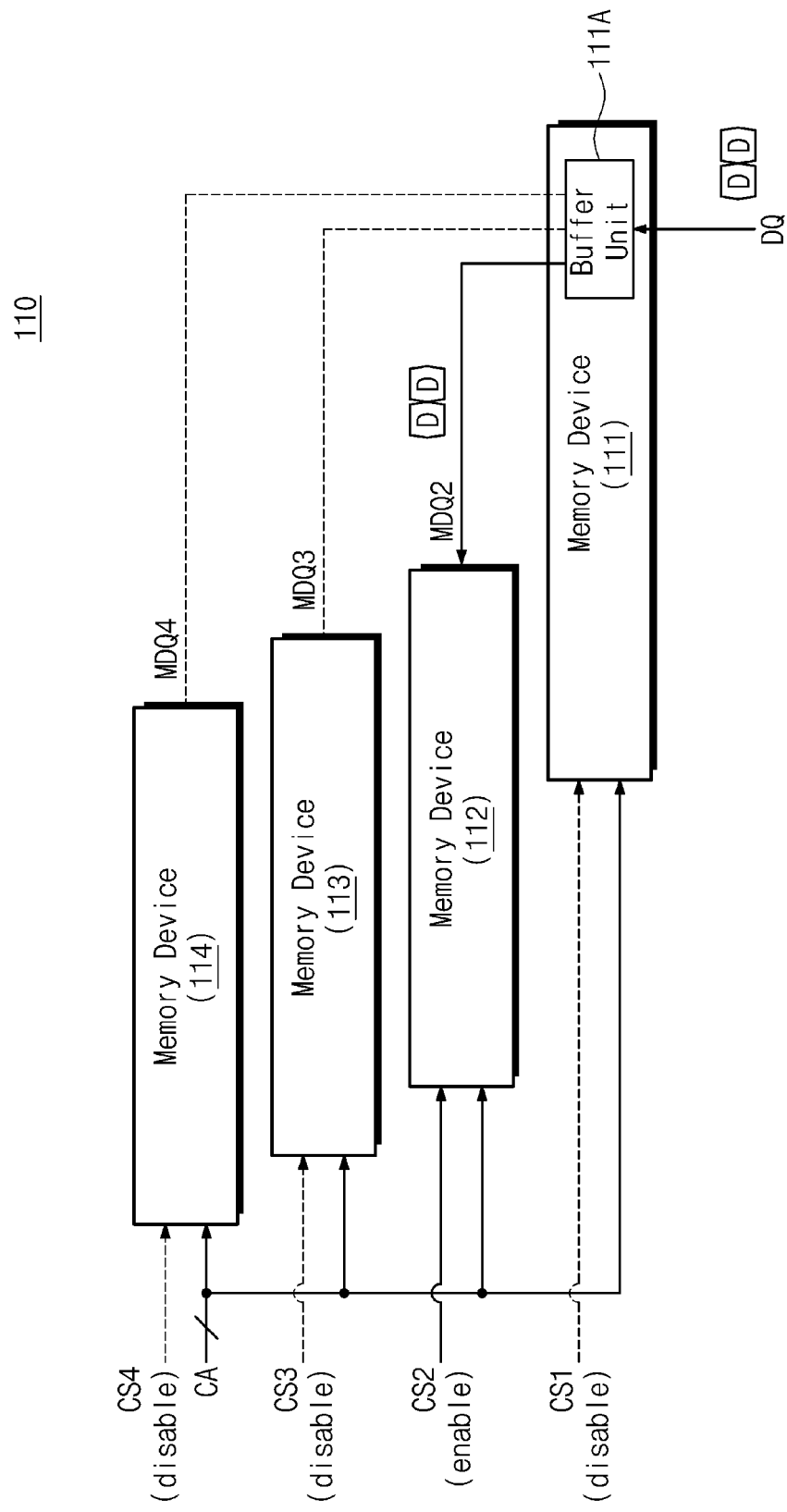
FIGS. 4 and 5 are drawings for describing an operation of the memory package illustrated in FIG. 2B according to example embodiments.
Figure 5:
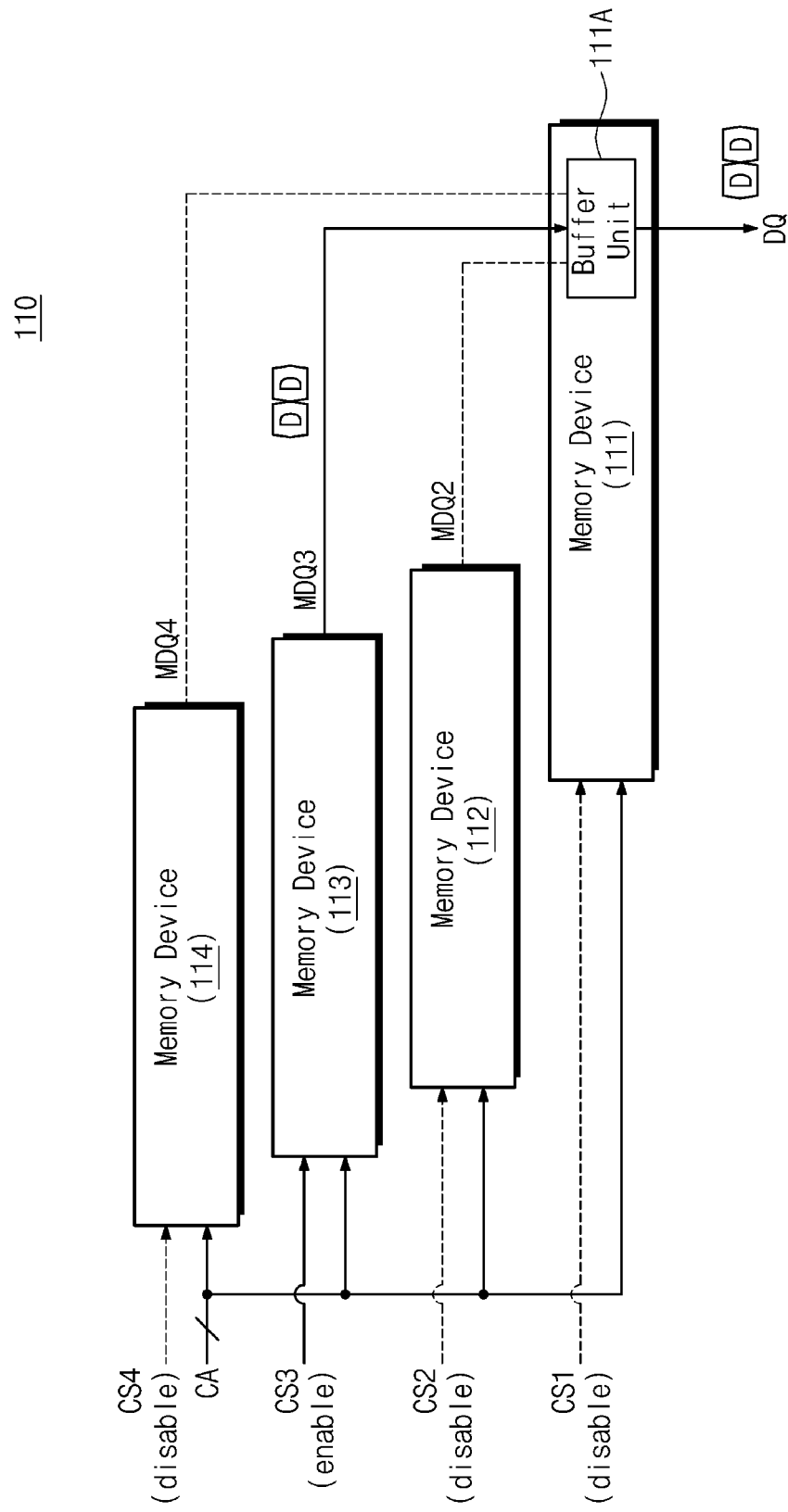

FIGS. 4 and 5 are drawings for describing an operation of the memory package illustrated in FIG. 2B according to example embodiments. For convenience of description, a detailed description of components, which are not needed to describe the operation of the memory package, and the above-described components will not be repeated here. A write operation of the memory package 110 will be described with reference to FIG. 4, and a read operation thereof will be described with reference to FIG. 5.

Referring to FIGS. 1, 2B, and 4, it is assumed that the second chip select signal CS2 of the chip select signals CS1 to CS4 from the module driver 101 is activated and the remaining chip select signals CS1, CS3, and CS4 are deactivated. This means that there is a need for the write operation of a second memory device 112. In this case, even though the same command/address CA is provided to all the memory devices 111 to 114, the remaining memory devices 111, 113, and 114 other than the second memory device 112 may not perform an operation corresponding to the command/address CA.

In example embodiments, the memory package 110 may receive data D1 through D8 from the processor 11. The data D1 through D8 from the processor 11 may be first provided to the buffer unit 111A of a first memory device 111 through the data line DQ. The buffer unit 111A may provide the data D2 and D6 to the second memory device 112 corresponding to the second chip select signal CS2. That is, the buffer unit 111A may provide the data D2 and D6 to the second memory device 112 through the second memory data line MDQ2.

The second memory device 112 may perform a write operation on the data D2 and D6 received through the second memory data line MDQ2 in response to the command/address CA.

In an embodiment, the buffer unit 111A may not provide the data "D" to the memory devices 111, 113, and 114 respectively corresponding to the deactivated chip select signals CS1, CS3, and CS4 through the internal data line IDQ and the memory data lines MDQ3 and MDQ4. Alternatively, the buffer unit 111A may provide the data "D to the memory devices 111, 113, and 114 through the internal data line IDQ and the memory data lines MDQ3 and MDQ4. In this case, even though the data "D" is provided to the memory devices 111, 113, and 114 through the internal and memory data lines IDQ, MDQ3, and MDQ4, the memory devices 111, 113, and 114 may not perform separate operations because deactivated by the chip select signals CS1, CS3, and CS4, respectively.

In an embodiment, although not illustrated in FIG. 4, the buffer unit 111A may receive the chip select signals CS1 to CS4 and may perform the above-described demultiplexing operation in response to the received chip select signals CS1 to CS4. Alternatively, although not illustrated in FIG. 4, the buffer unit 111A may receive a separate control signal from the module driver 101 or the processor 11 and may perform the above-described demultiplexing operation based on the received control signal. Alternatively, the buffer unit 111A may receive separate signals (e.g., address decoding information) from the memory devices 111 to 114 and may perform the above-described demultiplexing operation in response to the received signals.

A frequency of the data "D" received through the data line DQ may be different from a frequency of the data "D" provided from the buffer unit 111A. For example, the frequency of the data "D" received through the data line DQ may be greater than the frequency of the data "D" provided from the buffer unit 111A.

Referring to FIGS. 1, 2B, and 5, it is assumed that the third chip select signal CS3 of the chip select signals CS1 to CS4 from the module driver 101 is activated and the remaining chip select signals CS1, CS2, and CS4 are deactivated. In this case, as in the above description, the third memory device 113 may be activated, and the remaining memory devices 111, 112, and 114 may be deactivated. That is, in response to the command/address CA, the third memory device 113 may output the data "D" through the third memory data line MDQ3.

The buffer unit 111A may receive the data "D" through the third memory data line MDQ3 and may provide the received data "D" to the processor 11 through the data line DQ.

In an embodiment, the buffer unit 111A may perform the above-described multiplexing operation in response to the chip select signals CS1 to CS4, a separate control signal from the module driver 101, the processor 11, or separate signals from the memory devices 111 to 114.

In addition, the buffer unit 111A may perform various operations that will be described later in response to chip select signals, a separate control signal from the module driver 101 or the processor 11, or separate signals from the memory devices 111 to 114.

As described above, one memory package 110 may include the plurality of memory devices 111 to 114, and the memory devices 111 to 114 may be respectively activated in response to the chip select signals CS1 to CS4 different from each other. At least one memory device 111 of the memory devices 111 to 114 may include the buffer unit 111A, and the buffer unit 111A may multiplex/demultiplex the internal data line IDQ, the memory data lines MDQ2 to MDQ4, and the data line DQ. Accordingly, as described with reference to FIG. 2B, even though the data storage capacity of the memory package 110 increases, the data transfer rate may be improved through the buffer unit 111A.

Figure 6:
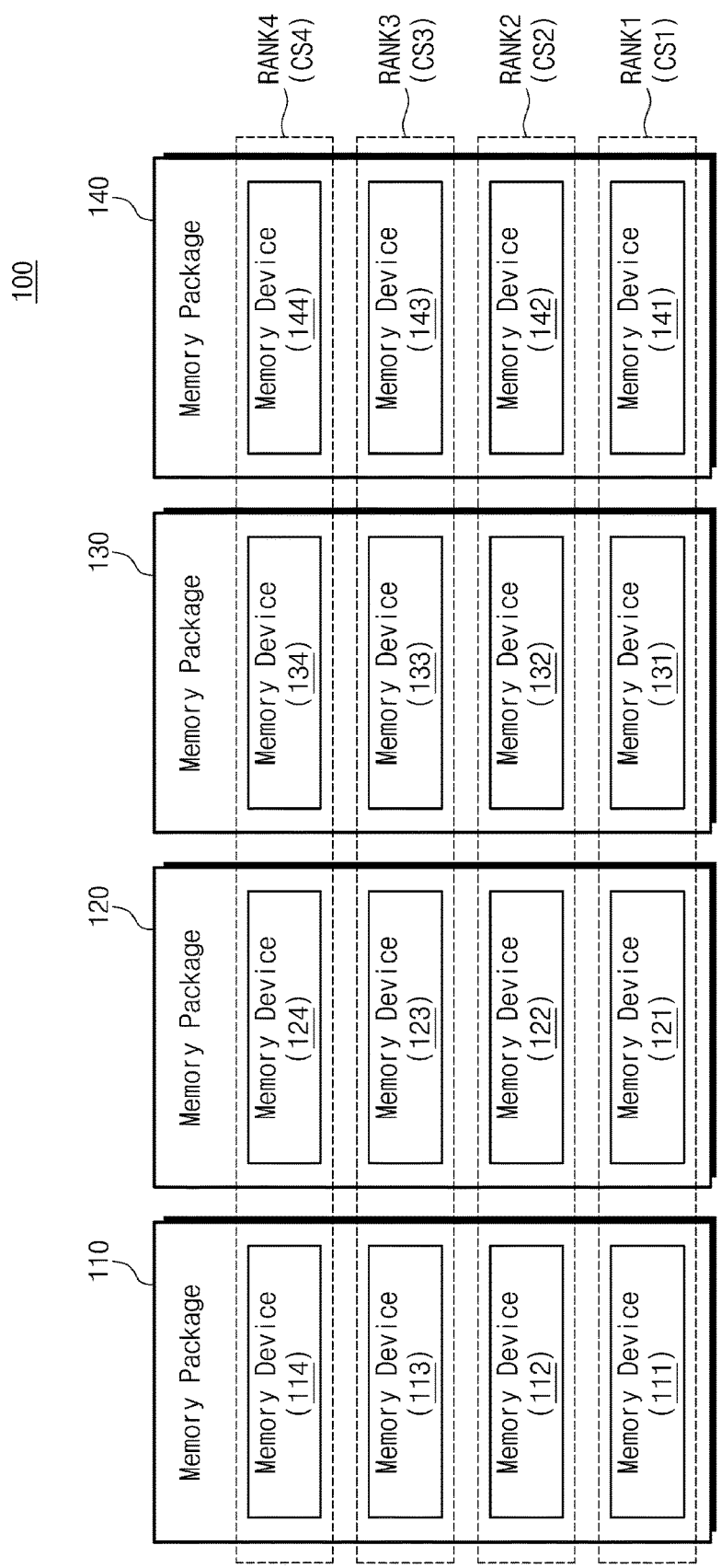
FIG. 6 is a block diagram for describing an operation of the memory module illustrated in FIG. 1 according to example embodiments.

FIG. 6 is a block diagram for describing an operation of the memory module illustrated in FIG. 1 according to example embodiments. For ease of illustration and for convenience of description, some of components of the memory module 100 are illustrated in FIG. 6. Referring to FIGS. 1 to 6, the memory module 100 may include first, second, third, and fourth memory packages 110, 120, 130, and 140. As illustrated in FIG. 6, the first memory package 110 may include memory devices 111 to 114, the second memory package 120 may include memory devices 121 to 124, the third memory package 130 may include memory devices 131 to 134, and the fourth memory package 140 may include memory devices 141 to 144.

In an embodiment, each of the second to fourth memory packages 120 to 140 may be a memory package similar to the first memory package 110 described with reference to FIGS. 2A, 2B, and 3 to 5 or may operate based on the operating method described with reference to FIGS. 2A, 2B, and 3 to 5.

In an embodiment, the first to fourth memory packages 110 to 140 may perform a 4-rank operation. For example, the memory devices 111, 121, 131, and 141 of the first to fourth memory packages 110 to 140 may constitute a first rank RANK1 and may operate in response to the first chip select signal CS1. Likewise, the memory devices 112, 122, 132, and 142 of the first to fourth memory packages 110 to 140 may constitute a second rank RANK2 and may operate in response to the second chip select signal CS2. The memory devices 113, 123, 133, and 143 of the first to fourth memory packages 110 to 140 may constitute a third rank RANK3 and may operate in response to the third chip select signal CS3. The memory devices 114, 124, 134, and 144 of the first to fourth memory packages 110 to 140 may constitute a fourth rank RANK4 and may operate in response to the fourth chip select signal CS4.

In conventional memory packages, a plurality of memory packages constitute one rank. In example embodiments, the plurality of memory packages 110 to 140 may constitute a plurality of ranks RANK1 to RANK4. That is, a multi-rank operation may be performed on a plurality of ranks in one memory package.

Figure 7:
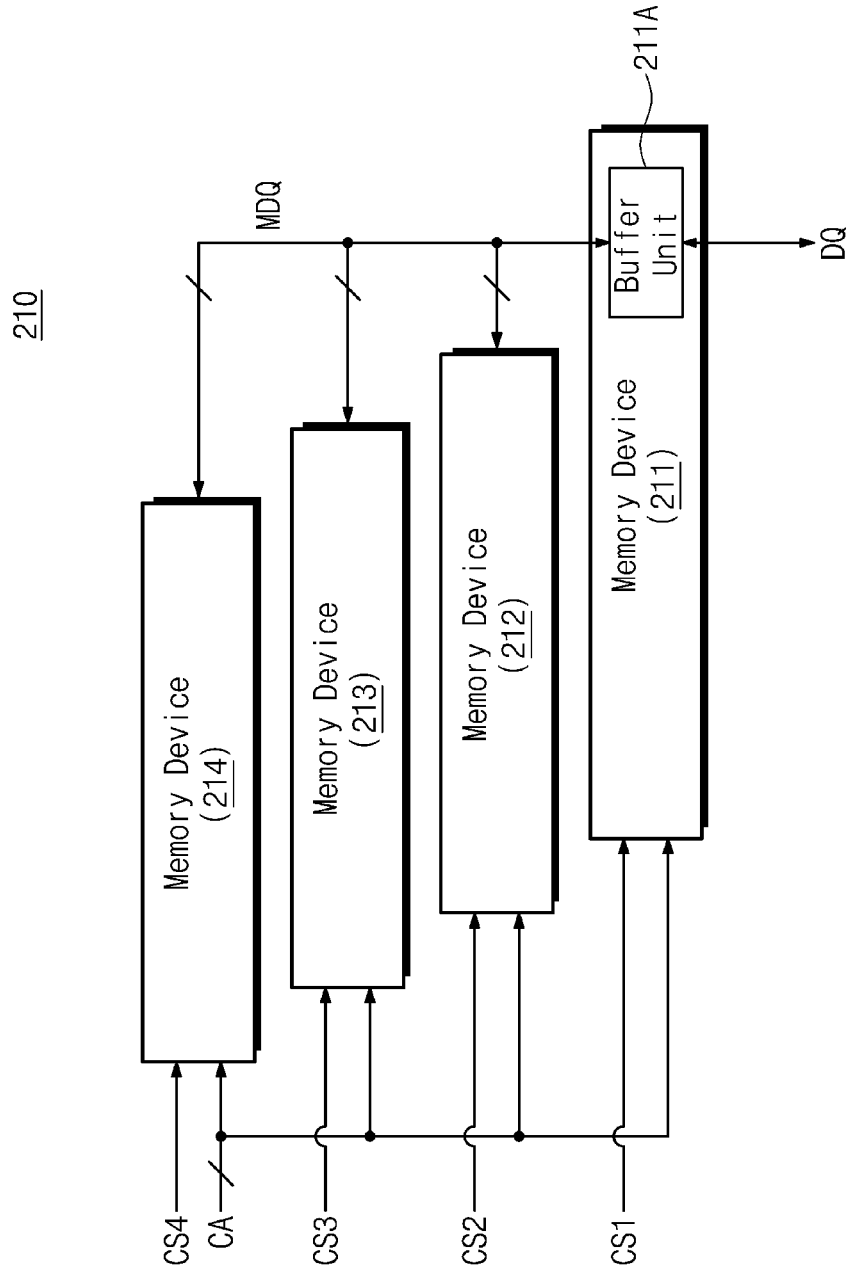
FIG. 7 is a block diagram illustrating another example of the memory package illustrated in FIG. 1 according to example embodiments.

FIG. 7 is a block diagram illustrating another example of the memory package illustrated in FIG. 1 according to example embodiments. Referring to FIG. 7, a memory package 210 may include memory devices 211, 212, 213, and 214. The memory devices 211 to 214 are similar to the memory devices of FIGS. 2A, 2B, and 3 to 6 described above, and thus a detailed description of the memory devices 211, 212, 213, and 214 will not be repeated here.

Unlike the memory package 110 described with reference to FIG. 2B, the memory package 210 of FIG. 7 is configured such that the memory devices 211 to 214 share the memory data line MDQ. For example, the memory devices 212 to 214 may be connected with the buffer unit 211A of the memory device 211 through the memory data line MDQ.

In example embodiments, although not illustrated in FIG. 7, each of the memory devices 211 to 214 may have a buffer unit, and each buffer unit may be connected to the memory data line MDQ.

The buffer unit 211A of the memory device 211 may provide data received through the data line DQ to the memory devices 212 to 214 through the memory data line MDQ or may provide data to the memory device 211 through the internal data line IDQ. The memory devices 211 to 214 may be respectively activated in response to the first to fourth chip select signals CS1 to CS4. An activated memory device may perform a write operation on data received through the memory data line MDQ and the internal data line IDQ or may output data through the memory data line MDQ and the internal data line IDQ.

In an embodiment, since the memory devices 212 to 214 share the memory data line MDQ, when one memory device is activated, the remaining memory devices may be deactivated. In an embodiment, during a write operation, two or more memory devices may be activated such that data from the memory data line MDQ is written in all the activated memory devices.

Figure 8:
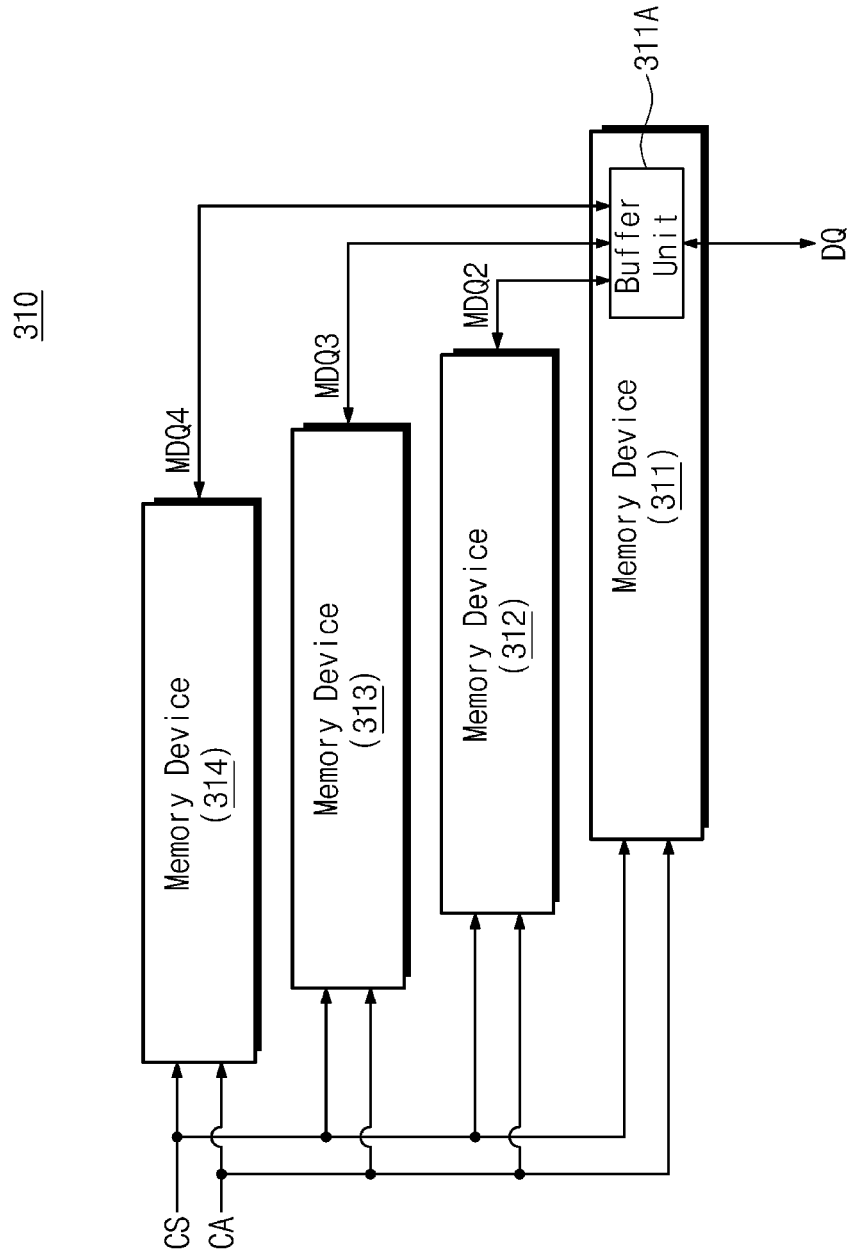
FIG. 8 is a block diagram illustrating another example of the memory package illustrated in FIG. 1 according to example embodiments.
Figure 9:
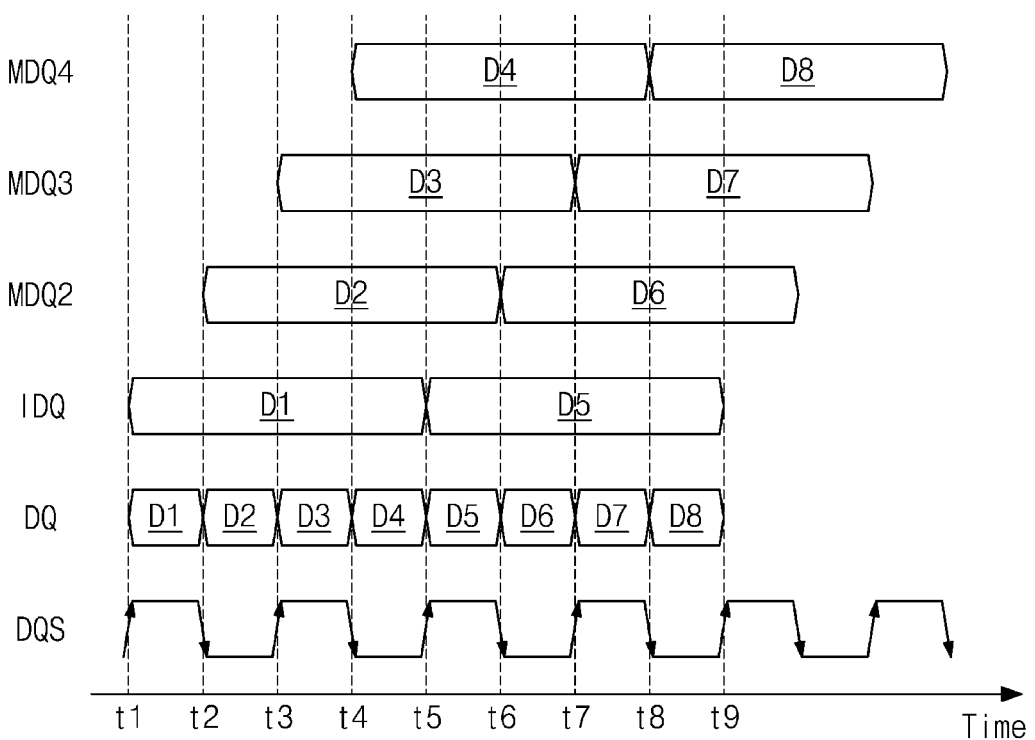
FIG. 9 is a timing diagram for describing an operation of the memory package of FIG. 8 according to example embodiments.

FIG. 8 is a block diagram illustrating another example of the memory package illustrated in FIG. 1 according to example embodiments. FIG. 9 is a timing diagram for describing an operation of the memory package of FIG. 8 according to example embodiments. In FIG. 9, an X-axis represents a time. For ease of illustration and for convenience of description, components and signals that are not needed to describe an operation of a memory package 310 may be omitted.

Referring to FIGS. 1, 8, and 9, the memory package 310 may include memory devices 311 to 314. The memory devices 311 to 314 are similar to the memory devices of FIGS. 2A, 2B, and 3 to 7 described above, and thus a detailed description thereof will not be repeated here.

Unlike the memory devices 111 to 114 of FIG. 2B, the memory devices 311 to 314 of FIG. 8 may operate in response to one chip select signal CS. That is, the memory devices 311 to 314 may share the same chip select signal CS and may be activated or deactivated in response to the same chip select signal CS.

A buffer unit 311A of the memory device 311 may multiplex/demultiplex the internal data line IDQ, the memory data lines MDQ2 to MDQ4, and the data line DQ. For example, the buffer unit 311A may select the internal data line IDQ or one of the memory data lines MDQ2 to MDQ4 in response to the command/address CA or a separate signal (not illustrated) and may exchange data through the selected data line. In an embodiment, the separate signal may indicate a rank select signal.

In an embodiment, the buffer unit 311A of the memory device 311 may perform a serializing/deserializing operation. For example, during a read operation, the buffer unit 311A may serialize data received from the memory devices 311 to 314 and may provide the serialized data to the processor 11 (refer to FIG. 1) through the data line DQ. For example, the buffer unit 311A may sequentially output data from the memory devices 311 to 314. Alternatively, during a write operation, the buffer unit 311A may deserialize data received from the processor 11 through the data line DQ and may provide the deserialized data to the memory devices 311 to 314 through the internal data line IDQ (refer to FIG. 3) and the memory data lines MDQ2 to MDQ4.

An operation in which serialization is made during the read operation will be more fully described with reference to FIG. 9. In an embodiment of FIG. 9, it is assumed that a burst length of data requested by the processor 11 is "8". That is, first to eighth data D1 to D8 may be output from the memory package 310 in response to one read command. In an embodiment, one data may include data bits of which the number (e.g., 4 or 8) is predetermined.

As illustrated in FIG. 9, the memory devices 311 to 314 may output data D1 to D8. For example, the first memory device 311 may output first and fifth data D1 and D5 through the internal data line IDQ, the second memory device 312 may output second and sixth data D2 and D6 through the second memory data line MDQ2, the third memory device 313 may output third and seventh data D3 and D7 through the third memory data line MDQ3, and the fourth memory device 314 may output fourth and eighth data D4 and D8 through the fourth memory data line MDQ4.

The pieces of data from the memory devices 311 to 314 may be output during a period that is longer than a period of a data strobe signal DQS (or, a read data strobe signal RDQS). In an embodiment, the data strobe signal DQS may be a signal that has a frequency defined by a predetermined interface between the processor 11 and a memory module or between the processor 11 and a memory package. For example, the first data D1 from the first memory device 311 may be output during an interval between t1 and t5. That is, the first data D1 from the first memory device 311 may be output during a time corresponding to two times a period of the data strobe signal DQS. Likewise, each of the second to eighth data D2 to D8 may be output in synchronization with two times a period of the data strobe signal DQS during a time period between t2 to t9.

The buffer unit 311A of the memory device 311 may serialize the first to eighth data D1 to D8 received through the internal data line IDQ and the memory data lines MDQ2 to MDQ4 and may output the serialized data through the data line DQ. In this case, the buffer unit 311A may output the first to eighth data D1 to D8 in synchronization with the data strobe signal DQS. For example, the buffer unit 311A may output the first data D1 from the internal data line IDQ through the data line DQ during a time period between t1 and t2. Likewise, the buffer unit 311A may respectively output the second to eighth data D2 to D8 through the data line DQ in synchronization with the data strobe signal DQS during a time period between t2 and t9.

In an embodiment, the first to fourth memory devices 311 to 314 may simultaneously perform read operations in response to the command/address CA from the module driver 101. However, timings when pieces of data from the first to fourth memory devices 311 to 314 arrive at the buffer unit 311A may be different from each other. For example, the first data D1 from the first memory device 311 may be detected by the buffer unit 311A at t1. However, the second data D2 from the second memory device 312 may be detected by the buffer unit 311A at t2 that is later than t1.

That is, even though the first and second memory devices 311 and 312 perform the read operations at the same time, a time point when the first data D1 from the first memory device 311 arrives at the buffer unit 311A may be different from a time point when the second data D2 from the second memory device 312 arrives at the buffer unit 311A. The time difference (i.e., a delay time difference) may be caused by the internal data line IDQ of the memory device 311 and the memory data lines MDQ2 to MDQ4 of the memory devices 312 to 314. For example, physical lengths of the internal data line IDQ and the memory data lines MDQ2 to MDQ4 may be different from each other. The delay time difference may be caused by the differences of physical lengths between data lines.

In example embodiments, the delay time difference between the first to eighth data D1 to D8 may be adjusted by a control signal (e.g., a chip select signal or a command) from the module driver 101 or the processor 11 so that the first to eighth data D1 to D8 may be synchronized with the data strobe signal DQS.

In response to control signals from the module driver 101 or the processor 11, the memory device 311 may provide the first and fifth data D1 and D5 through the internal data line IDQ, the memory device 312 may provide the second and sixth data D2 and D6 through the memory data line MDQ2, the memory device 313 may provide the third and seventh data D3 and D7 through the memory data line MDQ3, and the memory device 314 may provide the fourth and eighth data D4 and D8 through the memory data line MDQ4, to the buffer unit 311A. Thus, the buffer unit 311A may output first through eighth data D1 to D8 through the data line DQ to an external device (e.g., the processor 11). For example, the memory devices 311 to 314 may respectively output the pair data D1/D5, D2/D6, D3/D7, and D4/D8 in periods of the data strobe signal DQS (e.g., t1 to t9), and the buffer unit 311A may provide serialization data (e.g., D1 to D8) to the processor 11 in synchronization with the data strobe signal DQS.

In example embodiments, when the memory package 310 includes first to eighth memory devices stacked with each other, the buffer unit 311A may provide first to sixteenth data from the first to eighth memory devices through an internal data line IDQ and memory data lines MDQs, to the processor 11 in synchronization with the data strobe signal DQS.

A memory package according to example embodiments of the present disclosure may reduce a latency associated with data input/output by overlapping delay time periods due to the differences of physical lengths between internal and memory data lines through the data serializing/deserializing operation.

An embodiment is exemplified in FIG. 9 as data serializing is made during the read operation. In addition, during a write operation, deserializing may be made to be reverse to a manner similar to the above-described manner. For example, the buffer unit 311A may receive the first to eighth data D1 to D8 through the data line DQ and may provide the first to eighth data D1 to D8 to the memory devices 311 to 314 through the internal data lined IDQ and the second to fourth memory data lines MDQ2 to MDQ4 as illustrated in FIG. 8.

In an embodiment, as the number of memory devices included in one memory package increases, a period of data transmitted and received through the internal data line IDQ and the memory data line MDQ may also increase. Alternatively, in one memory package, as the number of memory devices sharing a chip select signal increases, a period of data transmitted and received through the internal data lined IDQ and the memory data line MDQ may also increase. For example, in a case where eight memory devices included in one memory package share the same chip select signal, a period of data exchanged through the internal data lined IDQ and the memory data lines MDQs may be eight times a period of the data strobe signal DQS.

The timing diagram illustrated in FIG. 9 is an example for describing an embodiment of the inventive concept, and embodiments of the inventive concept may not be limited to the timing diagram illustrated in FIG. 9. For example, timing when data is input and output through the data line DQ may be different from the timing illustrated in FIG. 9.

According to the above-described embodiment of the inventive concept, even though a plurality of memory devices included in one memory package share the same chip select signal, data input/output may be implemented normally through serializing/deserializing of a buffer unit.

Figure 10:
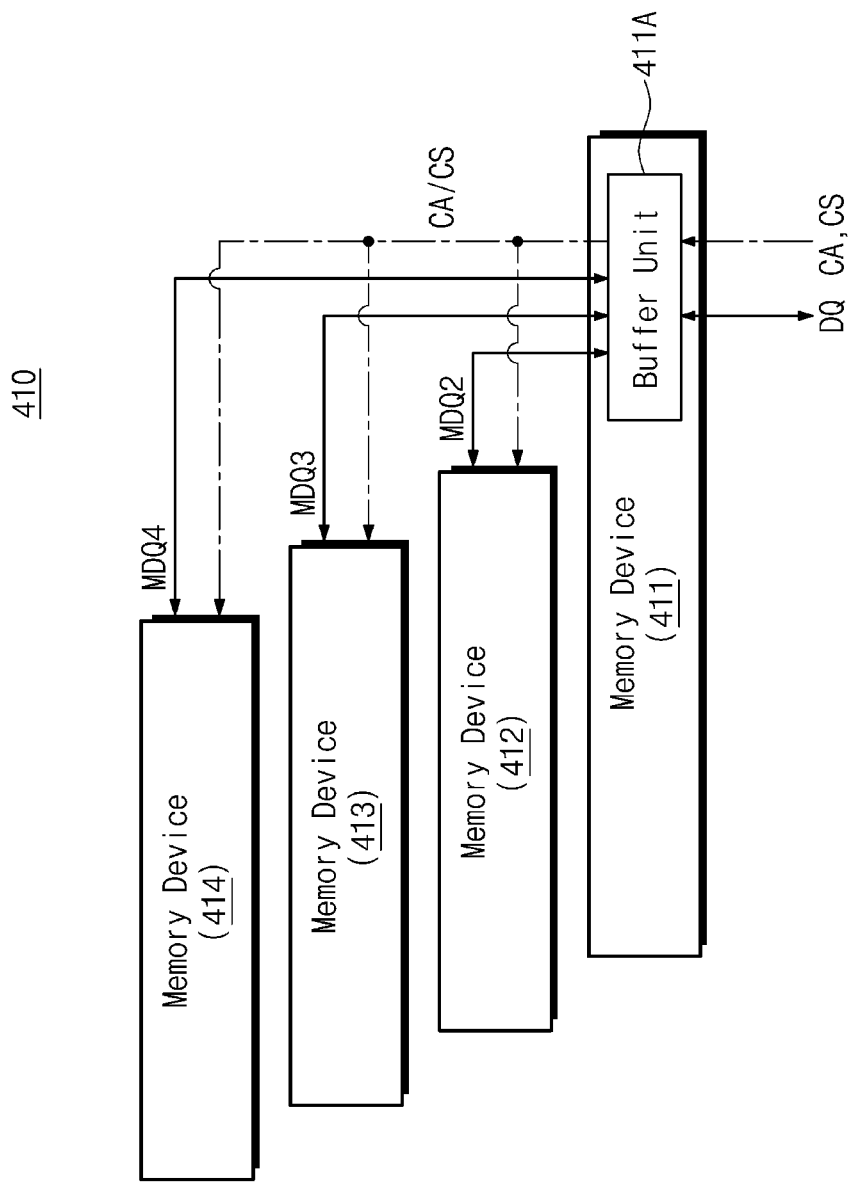
FIG. 10 is a block diagram illustrating another example of the memory package illustrated in FIG. 1 according to example embodiments.

FIG. 10 is a block diagram illustrating another example of the memory package illustrated in FIG. 1 according to example embodiments. Referring to FIGS. 1 and 9, a memory package 410 may include first, second, third, and fourth memory devices 411, 412, 413, and 414. The first to fourth memory devices 411 to 414 are similar to the memory devices of FIGS. 2A, 2B, and 3 to 9 described above, and thus a detailed description thereof will not be repeated here.

In example embodiments, the memory device 411 may include a buffer unit 411A. Even though not illustrated in FIG. 10, the memory devices 412 to 414 may respectively include buffer units 412A to 414A.

Unlike the buffer unit 111A of FIG. 2B, the buffer unit 411A of FIG. 10 may receive the command/address CA and the chip select signal CS from the module driver 101. The buffer unit 411A of the memory device 411 may provide the received command/address CA and chip select signal CS to the memory devices 412 to 414. That is, the buffer unit 411A may operate as a buffer of the command/address CA and the chip select signal CS.

In an embodiment, although not illustrated in FIG. 10, as described above, the buffer unit 414A may provide different chip select signals to the memory devices 411 to 414, respectively. Also, the memory devices 412 to 414 may be configured to share the same memory data line MDQ as described with reference to FIG. 7.

In an embodiment, as illustrated in FIG. 1, each of the memory packages 110 to 180 may include a plurality of memory devices. The module driver 101 may be configured such that the command/address CA and the chip select signal CS are directly provided to each of all the memory devices included in each of the memory packages 110 to 180. In this case, the load of lines for providing the command/address CA may increase as the number of memory devices provided with the command/address CA and the chip select signal CS from the module driver 101 increases. For this reason, the command/address CA may not be provided normally.

The buffer unit 411A according to an embodiment may reduce the load of signal lines for providing the command/address CA and the chip select signal CS of the module driver 101 by performing a buffer function on the command/address CA and the chip select signal CS. Accordingly, even though the number of memory devices included in one memory package increases, the command/address CA and the chip select signal CS may be provided normally.

In an embodiment, although not illustrated in FIG. 10, each of a plurality of memory devices included in one memory package may include a buffer unit. The buffer unit included in each memory device may be activated or deactivated by a fuse setting or a separate setting. An activated buffer unit may perform an operation described with reference to FIGS. 1, 2A, 2B, and 3 to 9. Instead of performing the operation described with reference to FIGS. 1, 2A, 2B, and 3 to 9, deactivated buffer units may provide simply a data transmission path of each of the memory data lines MDQs or may provide a data transmission path between the memory data line MDQ and the internal data line IDQ of a memory device corresponding to the memory data line MDQ.

Figure 11:
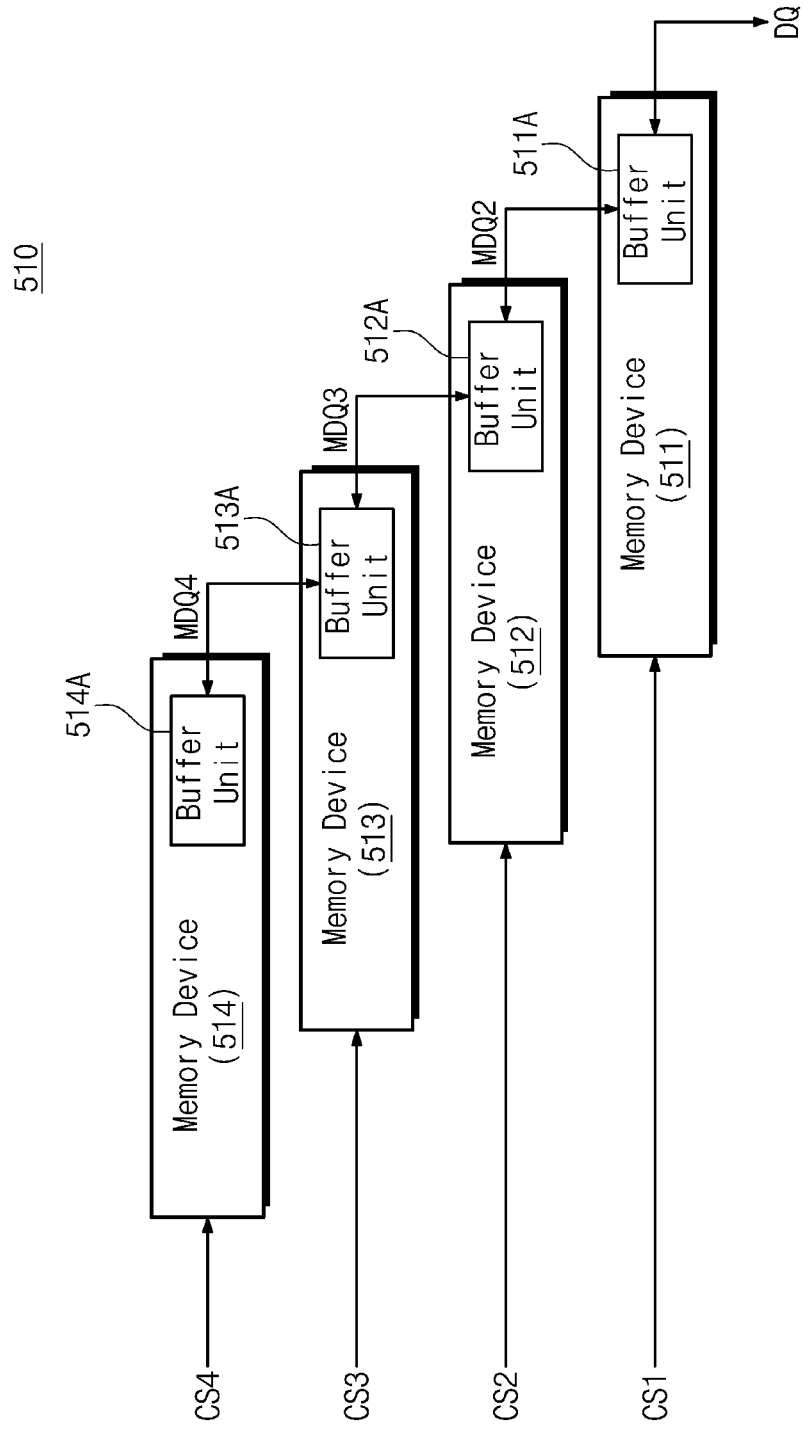
FIG. 11 is a block diagram illustrating another example of the memory package illustrated in FIG. 1 according to example embodiments.

FIG. 11 is a block diagram illustrating another example of the memory package illustrated in FIG. 1 according to example embodiments. Referring to FIGS. 1 and 11, a memory package 510 may include first, second, third, and fourth memory devices 511, 512, 513, and 514. The first to fourth memory devices 511 to 514 may include buffer units 511A to 514A, respectively. Each of the buffer units 511A to 514A may be the buffer unit described with reference to FIGS. 1, 2A, 2B, and 3 to 9 or may perform the operation described with reference to FIGS. 1, 2A, 2B, and 3 to 9. The first to fourth memory devices 511 to 514 may respectively receive the chip select signals CS1 to CS4.

In example embodiments, the buffer unit 511A of the first memory device 511 is connected with the processor 11 through the data line DQ and with the buffer unit 512A of the second memory device 512 through the second memory data line MDQ2. The buffer unit 512A is connected with the buffer unit 513A of the third memory device 513 through the third memory data line MDQ3. The buffer unit 513A is connected with the buffer unit 514A of the fourth memory device 514 through the fourth memory data line MDQ4. Each of the buffer units 511A to 514A may exchange data with each of the memory devices 511 to 514 through the corresponding internal data line (not illustrated).

It is assumed that during a write operation, the second chip select signal CS2 is activated and the other chip select signals CS1, CS3, and CS4 are deactivated. In this case, the buffer unit 511A of the first memory device 511 may receive write data from the processor 11 through the data line DQ. The buffer unit 511A may provide data to the second buffer unit 512A through the second memory data line MDQ2 in response to the deactivated first chip select signal CS1. In response to the activated second chip select signal CS2, the buffer unit 512A may provide the received data to an input/output circuit (not illustrated) of the second memory device 512 through the internal data line IDQ (refer to FIG. 3) included in the second memory device 512 and the second memory device 512 may write the write data in a memory cell array (not illustrated).

As described above, the buffer units 511A to 514A may provide data to the corresponding memory devices 511 to 514 in response to the chip select signals CS1 to CS4. Alternatively, each of the buffer units 511A to 514A may provide data to a different memory device in response to corresponding memory data line MDQ.

In an embodiment, during a read operation, the buffer units 511A to 514A may operate as in the above description. For example, in the read operation, in a case where the second chip select signal CS2 is activated and the chip select signals CS1, CS3, and CS4 are deactivated, the buffer unit 512A of the second memory device 512 may provide data read from a second memory cell array of the second memory device 512 to the buffer unit 511A of the first memory device 511 through the second memory data line MDQ2. The buffer unit 511A may provide read data received through the second memory data line MDQ2 to the processor 11 through the data line DQ.

According to the above-described embodiments, at least one of a plurality of memory devices included in one memory package includes a buffer unit. The buffer unit may be connected with the processor 11 through the data line DQ and may be connected with a plurality of memory devices through the memory data line MDQ. The buffer unit, as described above, may perform a multiplexing/demultiplexing operation between the data line DQ and the memory data line MDQ. Alternatively, the buffer unit, as described above, may perform a serializing/deserializing operation between the data line DQ and the memory data line MDQ. With the above description, the load of a channel may decrease through the above-described buffer unit, thereby improving a data transfer rate and making it possible to increase the data storage capacity of a memory package.

Figure 12:
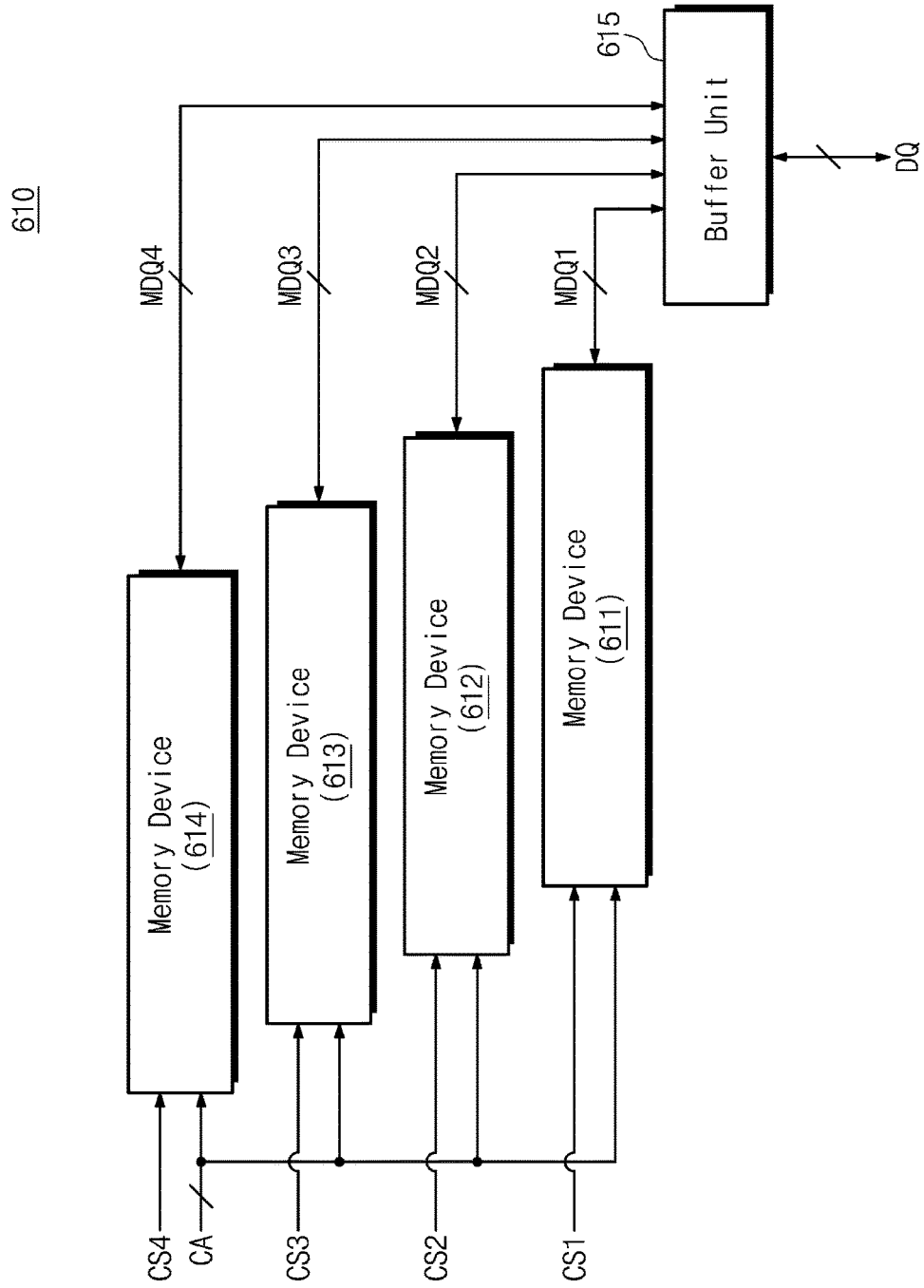
FIG. 12 is a block diagram illustrating another example of the memory package illustrated in FIG. 1 according to example embodiments.

FIG. 12 is a block diagram illustrating another example of the memory package illustrated in FIG. 1 according to example embodiments. Referring to FIGS. 1 and 12, a memory package 610 may include a plurality of memory devices 611, 612, 613, and 614 and a buffer unit 615. The memory devices 611 to 614 are similar to the memory devices described with reference to FIGS. 2A, 2B, 3 to 8, 10, and 11, and thus a detailed description thereof will not be repeated here.

Unlike the above-described memory packages 110 to 510, the memory package 610 of FIG. 12 may include the separate buffer unit 615. In the embodiments of FIGS. 1, 2A, 2B, and 3 to 10, a buffer unit may be included in at least one of a plurality of memory devices. However, in the embodiment of FIG. 12, the buffer unit 615 may be implemented with a separate semiconductor chip or semiconductor die that is different from the memory devices 611 to 614.

The buffer unit 615 may be connected with first to fourth memory devices 611 to 614 through the first to fourth memory data lines MDQ1 to MDQ4, respectively. Each of the first to fourth memory devices 611 to 614 may receive the command/address CA from the module driver 101. The first to fourth memory devices 611 to 614 may respectively receive the first to fourth chip select signals CS1 to CS4 from the module driver 101.

The buffer unit 615 may perform the operations described with reference to FIGS. 1, 2A, 2B, and 3 to 11. In an embodiment, the buffer unit 615 may perform a multiplexing/demultiplexing operation between the data line DQ and the memory data lines MDQ1 to MDQ4. Alternatively, the buffer unit 615 may perform a serializing/deserializing operation between data transmitted/received to/from the memory devices 611 to 614 and data transmitted/received to/from the processor 11.

Although not illustrated in FIG. 12, as in a description given with reference to FIGS. 1, 2A, 2B, and 3 to 12, the memory devices 611 to 614 may be configured to share one chip select signal or to share the same memory data line MDQ. Also, as in the above description, the buffer unit 615 may perform a buffer function of receiving and buffering the command/address CA and the chip select signal CS from the module driver 101.

Figure 13:
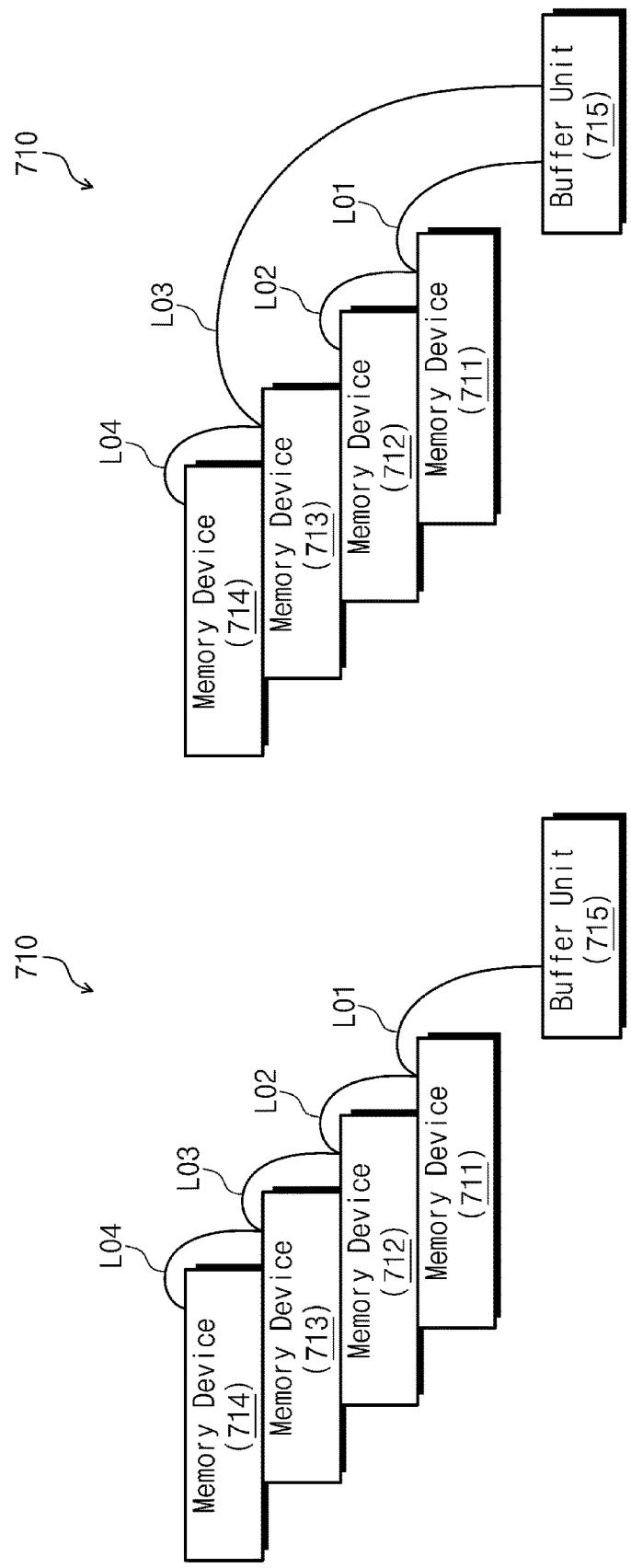
FIGS. 13A and 13B are drawings illustrating connection arrangements between memory devices and a buffer unit included in the memory package of FIG. 1 according to example embodiments.

FIGS. 13A and 13B are drawings illustrating connection structures between memory devices and a buffer unit included in the memory package of FIG. 1 according to example embodiments. For convenience of description, some of components for connection between memory devices and a buffer unit are illustrated in FIGS. 13A and 13B. In addition, it is assumed that components for connection between the memory devices and the buffer unit are connected to each other through bonding wires. However, embodiments are not limited thereto. For example, the components for connection and the way to connect may be variously changed or modified without departing from the scope and spirit of the inventive concept.

Referring to FIGS. 13A and 13B, a memory package 710 may include a plurality of memory devices 711, 712, 713, and 714 and a buffer unit 715. The memory devices 711 to 714 may be connected with the buffer unit 715 through first, second, third, and fourth lines L01, L02, L03, and L04. For example, as illustrated in FIG. 13A, a first memory device 711 may be connected with the buffer unit 715 through the first line L01, a second memory device 712 may be connected with the first memory device 711 through the second line L02, a third memory device 713 may be connected with the second memory device 712 through the third line L03, and a fourth memory device 714 may be connected with the fourth memory device 714 through the fourth line L04. In example embodiments, the first to fourth memory devices 711 to 714 may share the first to fourth lines L01 to L04 and may be connected with the buffer unit 715 through the first to fourth lines L01 to L04.

Alternatively, as illustrated in FIG. FIG. 13B, the first memory device 711 is connected with the buffer unit 715 through the first line L01. The second memory device 712 is connected with the first memory device 711 through the second line L02. That is, the second memory device 712 may be connected with the buffer unit 715 through the first and second lines L01 and L02. Likewise, the third memory device 713 is connected with the buffer unit 715 through a third line L03', and the fourth memory device 714 is connected with the buffer unit 715 through the fourth line L04. That is, the fourth memory device 714 may be connected with the buffer unit 715 through the third and fourth lines L03' and L04. In example embodiments, the memory devices 711 to 714 may be classified into a first group including the first and second memory devices 711 and 712 and a second group including the third and fourth memory devices 713 and 714. Memory devices in each group may be configured to share a wire.

In an embodiment, although not illustrated in FIGS. 13A and 13B, the first memory device 711 of the first group and the third memory device 713 of the second group may operate in response to the same first chip select signal, and the second memory device 712 of the first group and the fourth memory device 714 of the second group may operate in response to the same second chip select signal. That is, chip select signals to be provided to the memory devices 711 to 714 may be variously changed or modified.

For example, complexity of wires may be reduced by arranging wires between memory devices and a buffer unit as illustrated in FIGS. 13A and 13B. Although not illustrated FIGS. 13A and 13B, the way to arrange wires may be variously changed or modified. For example, the memory package 710 may further include a plurality of memory devices. The memory devices may be classified into a plurality of groups. In this case, the groups are three or more, or memory devices included in each group may be two or more. The memory devices in each group may be connected with a buffer unit through the same wire.

Figure 14:
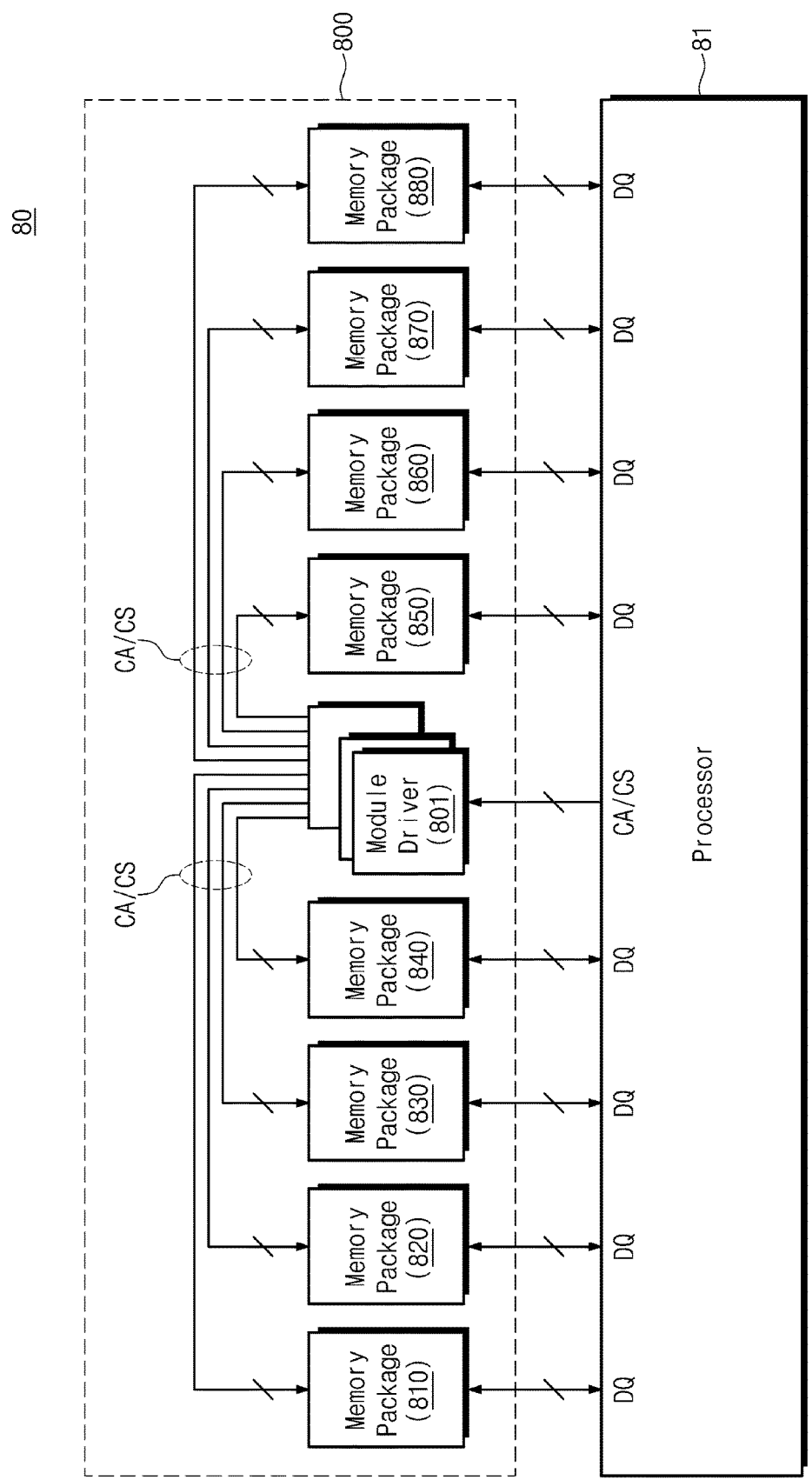
FIG. 14 is a block diagram illustrating a user system to which the memory module according to an example embodiment is applied.

FIG. 14 is a block diagram illustrating a user system to which the memory module according to an example embodiment is applied. Referring to FIG. 14, a user system 80 may include a processor 81 and a memory module 800. The processor 81 is similar to the processor 11 described with reference to FIG. 1, and thus a detailed description thereof will not be repeated here.

The memory module 800 may include a plurality of memory packages 810 to 880 and a module driver 801. Each of the memory packages 810 to 880 may be the memory package described with reference to FIGS. 1, 2A, 2B, 3 to 12, 13A, and 13B or may perform the operations described with reference to FIGS. 1, 2A, 2B, 3 to 12, 13A, and 13B.

Unlike the module driver 101 of FIG. 1, the module driver 801 of FIG. 14 may provide the command/address CA and the chip select signal CS to each of the memory packages 810 to 880 through a plurality of signal lines. For example, the module driver 801 may provide the command/address CA and the chip select signal CS to a first memory package 810 through a plurality of signal lines. The module driver 801 may provide the command/address CA and the chip select signal CS to a second memory package 810 through a plurality of signal lines that are different from the plurality of signal lines connected with the first memory package 810. For example, the module driver 801 may provide the command/address CA and the chip select signal CS to each of the memory packages 810 to 880 through different signal lines.

In example embodiments, in the module driver 801 of FIG. 14, the number of memory package groups to each of which the command/address CA and the chip select signal CS are applied may be more than that in the module driver 101 of FIG. 1. For example, the module driver 101 of FIG. 1 may divide the command/address CA and the chip select signal CS received from the processor 11 into two to provide them to the memory packages 110 to 180. Unlike the above description, the module driver 801 of FIG. 14 may divide the command/address CA and the chip select signal CS received from the processor 81 into eight to provide them to the memory packages 810 to 880.

In an embodiment, as described above, to increase the number of times that the command/address CA and the chip select signal CS of the module driver 801 are divided, the module driver 801 may include a function block or circuit for increasing the number of times. Alternatively, the module driver 801 may include a plurality of circuits, each of which is the same as the module driver 101 of FIG. 1.

As described above, since the module driver 801 provides the command/address CA and the chip select signal CS to each of the memory packages 810 to 880 through different signal lines, the loads of signal lines for the command/address CA and the chip select signal CS may decrease. Accordingly, the command/address CA and chip select signal CS may be provided normally to each of the memory devices 810 to 880.

Figure 15:
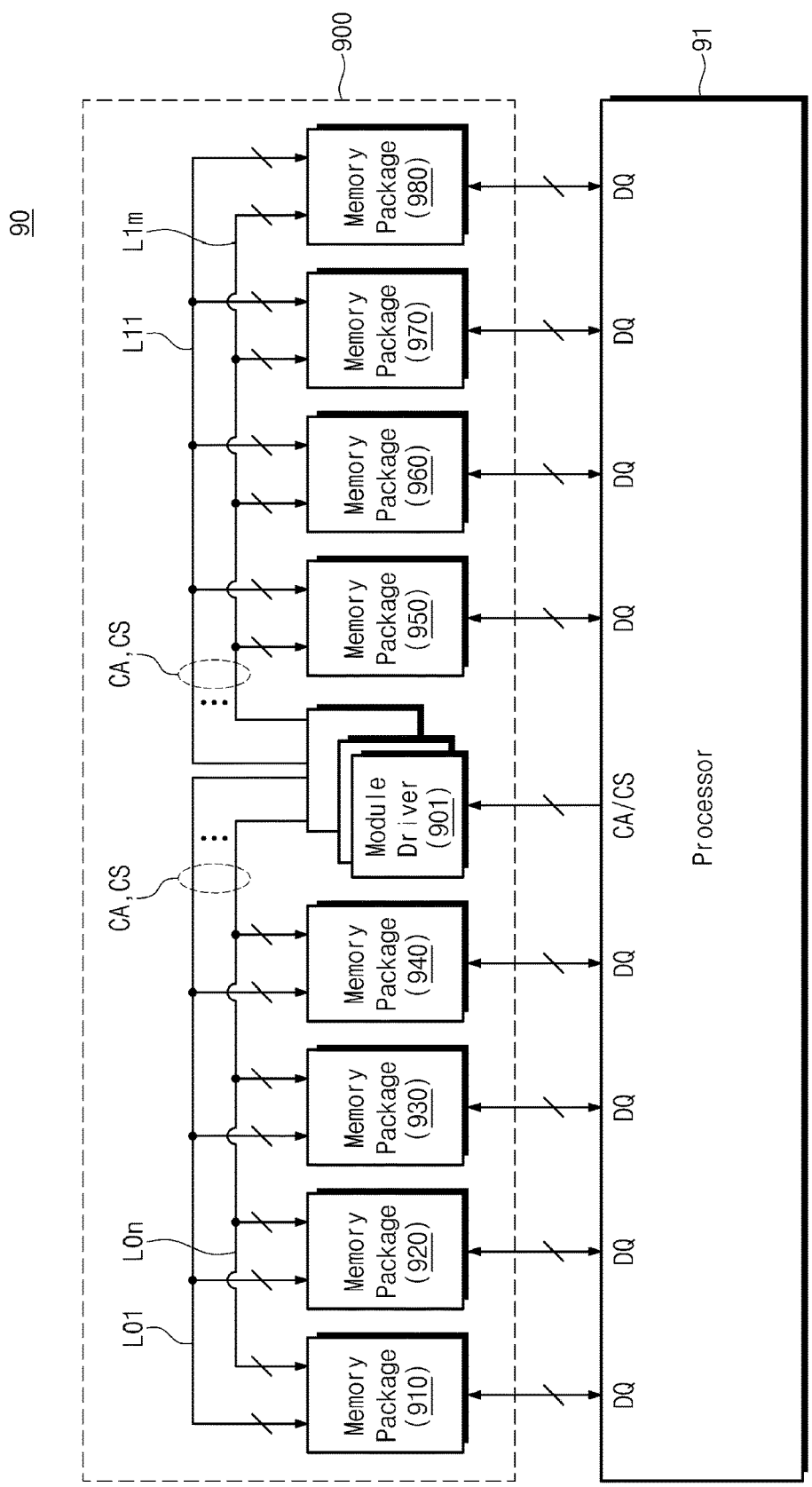
FIG. 15 is a block diagram illustrating a user system to which the memory module according to an example embodiment is applied.

FIG. 15 is a block diagram illustrating a user system to which the memory module according to an example embodiment is applied. Referring to FIG. 15, a user system 90 includes a memory module 900 and a processor 91, and the memory module 900 includes a plurality of memory packages 910 to 980 and a module driver 901. The processor 91 and the memory packages 910 to 980 are similar to the processor 81 and the memory packages 810 to 880 described with reference to FIG. 14, and thus a detailed description thereof will not be repeated here.

Unlike the module driver 801 of FIG. 14, the module driver 901 of FIG. 15 may provide the command/address CA and the chip select signal CS to each of the memory packages 810 to 880 through a plurality of signal lines L01 to L0$n$ and L11 to L1$m$.

In example embodiments, the module driver 901 may provide the command/address CA and the chip select signal CS to a first memory package 910 through the signal lines L01 to L0$n$. In an embodiment, the first memory package 910, as described above, may include a plurality of memory devices, and each of the memory devices may receive the command/address CA and the chip select signal CS from the signal lines L01 to L0$n$. In detail, a first memory device of the first memory package 910 may receive the command/address CA and the chip select signal CS through a first signal line L01. A second memory device of the first memory package 910 may receive the command/address CA and the chip select signal CS through a second signal line L02. Likewise, each of the memory devices may receive the command/address CA and the chip select signal CS from a corresponding one of the signal lines L01 to L0$n$.

As in those described above, each of the remaining memory packages 920 to 980 other than the first memory package 910 may include a plurality of memory devices, and the memory devices may respectively receive the command/address CA and the chip select signal CS from the signal lines L01 to L0$n$ and L11 to L1$m$.

As described above, the loads of signal lines for providing the command/address CA and the chip select signal CS may decrease by providing the command/address CA and the chip select signal CS to the memory packages 910 to 980 through the signal lines L01 to L0$n$ and L11 to L1$m$, respectively. Accordingly, even though the number of memory devices or memory packages increases to increase a capacity, the command/address CA and the chip select signal CS may be provided normally.

Figure 16:
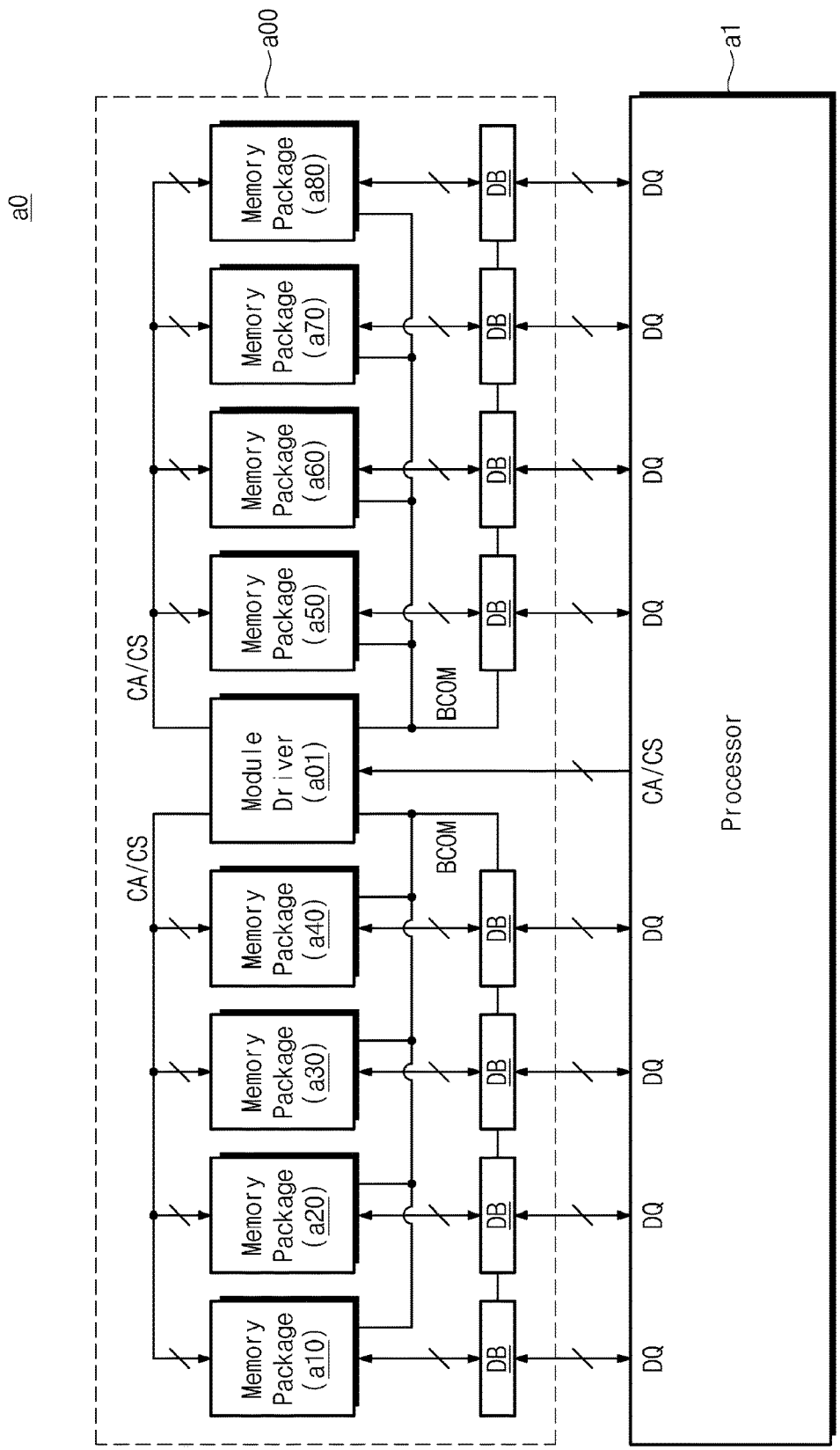
FIG. 16 is a block diagram illustrating a user system a0 to which the memory module according to an example embodiment is applied.

FIG. 16 is a block diagram illustrating a user system a0 to which the memory module according to an example embodiment is applied. Referring to FIG. 16, the user system a0 may include a memory module a00 and a processor a1. That is, the memory module a00 may have a structure of a load reduced DIMM (LRDIMM). The memory module a00 includes a plurality of memory packages a10 to a80, a module driver a01, and a plurality of data buffers DB. The processor a1, the memory packages a11 to a80, and the module driver a01 are similar to the memory packages and the module driver described above, and thus a detailed description thereof will not be repeated here.

Unlike the above-described memory module, the memory module a00 of FIG. 16 may further include the data buffers DB. The data buffers DB may exchange data with the processor a1 through the data line DQ. That is, each of the data buffers DB may exchange data with a corresponding one of the memory packages a10 to a80 through signal lines. In an embodiment, each of the data buffers DB may operate in response to a buffer command BCOM from the module driver a01. Each of the data buffers DB may temporarily store data provided from the corresponding one of the memory packages a10 to a80 or data provided from the processor a1 in response to the buffer command BCOM.

In an embodiment, the data buffers DB may perform a function of temporarily storing data between the processor a1 and the memory packages a10 to a80. However, as described above, unlike the data buffers DB, buffer units respectively included in the memory packages a10 to a80 may perform functions such as the above-described multiplexing/demultiplexing and serializing/deserializing. In an embodiment, the buffer units respectively included in the memory packages a10 to a80 may perform the above-described operations in response to the buffer command BCOM or a portion of the buffer command BCOM.

Figure 17:
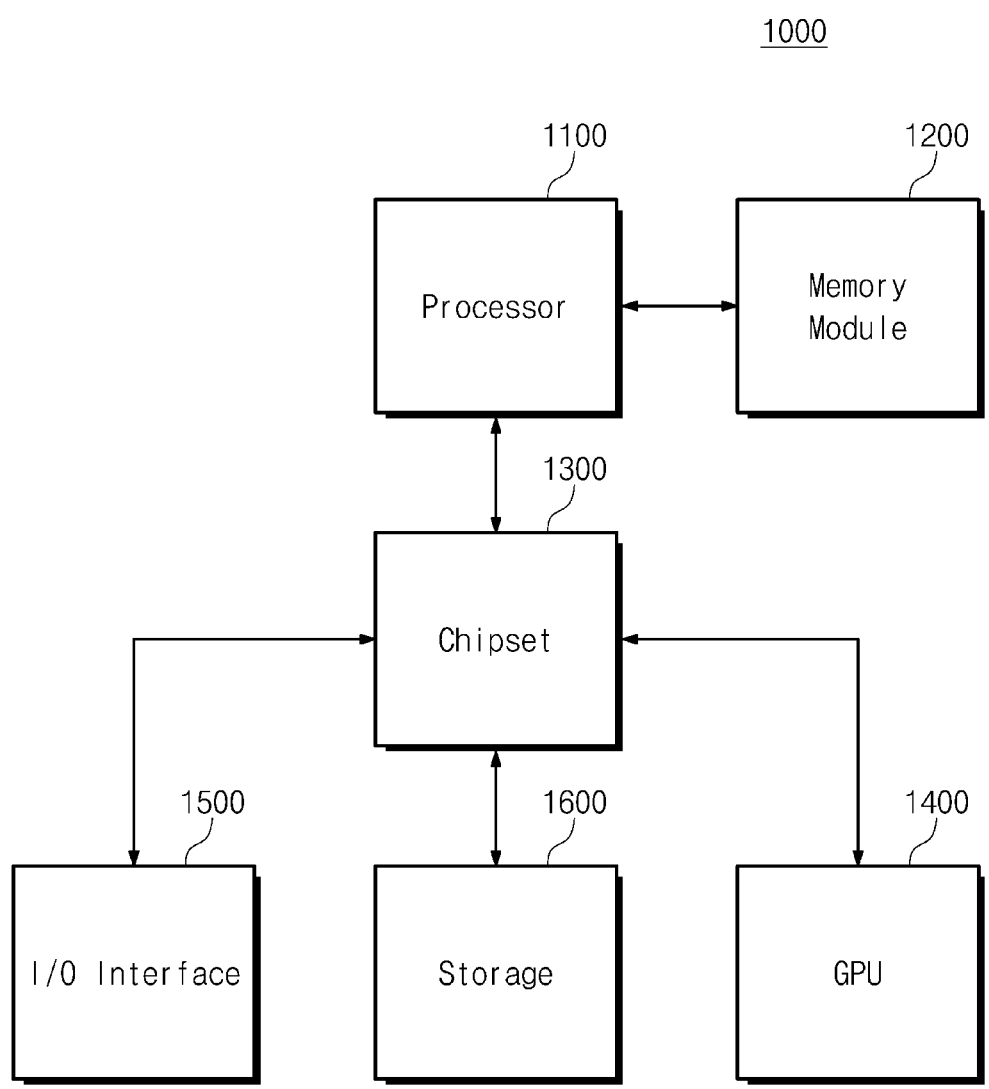
FIG. 17 is a block diagram illustrating a user system to which the memory module according to a certain embodiment is applied.

FIG. 17 is a block diagram illustrating a user system to which the memory module according to a certain embodiment is applied. Referring to FIG. 17, a user system 1000 may include a processor 1100, a memory module 1200, a chipset 1300, a graphics processing unit (GPU) 1400, an input/output interface 1500, and a storage 1600. In an embodiment, the user system 1000 may include a computer, a portable computer, a ultra-mobile personal computer (UMPC), a workstation, a server computer, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device capable of transmitting or receiving information in a wireless environment, or one of various electronic devices constituting a home network.

The processor 1100 may control overall operations of the user system 1000. The processor 1100 may perform various operations of the user system 1000.

The memory module 1200 may be directly connected with the processor 1100. For example, the memory module 1200 may have a dual in-line memory module (DIMM) form, and the memory module 1200 may be mounted on a DIMM socket, which is directly connected with the processor 1100, to communicate with the processor 1100. The memory module 1200 may be used as a main memory, a buffer memory, or a cache memory of the user system 1000. In an embodiment, the memory module 1200 may be the memory module described with reference to FIGS. 1, 2A, 2B, 3 to 12, 13A, 13B, and 14 to 16 and may perform the operation described with reference to FIGS. 1, 2A, 2B, 3 to 12, 13A, 13B, and 14 to 16.

The chipset 1300 may be electrically connected with the processor 1100 and may control hardware of the user system 1000 under control of the processor 1100. For example, the chipset 1300 may be respectively connected with the GPU 1400, the input/output interface 1500, and the storage 1600 through main buses and may perform a bridge operation on the main buses.

The GPU 1400 may perform a series of operations for outputting image data of the user system 1000. In an embodiment, the GPU 1400 may be embedded in the processor 1100 in the form of a system-on-chip.

The input/output interface 1500 may include various devices that input data or instructions in the user system 1000 or output data to the outside. For example, the input/output interface 1500 may include user input devices such as a keyboard, a keypad, a button, a touch panel, a touch screen, a touch pad, a touch ball, a camera, a microphone, a gyroscope sensor, a vibration sensor, a piezoelectric element, a temperature sensor, and a biometric sensor and user output devices such as a liquid crystal display (LCD), an organic light emitting diode (OLED) display device, an active matrix OLED (AMOLED) display device, a light emitting diode (LED), a speaker, and a motor.

The storage 1600 may be used as a mass storage medium of the user system 1000. The storage 1600 may include mass storage mediums such as a hard disk drive (HDD), a solid state drive (SSD), a memory card, and a memory stick. In an embodiment, the storage 1600 may include at least one of the memory packages of the memory module described with reference to FIGS. 1, 2A, 2B, 3 to 12, 13A, 13B, and 14 to 16.

According to example embodiments of the present disclosure, a memory device, a memory package including the same, and a memory module including the same may include a memory device that includes a buffer unit situated between an external device (e.g., a processor) and memory devices. According to an embodiment of the inventive concept, a memory device with an increased storage capacity and an improved performance, a memory package including the same, and a memory module including the same may be provided.

While the present disclosure has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A dynamic random access memory (DRAM) package comprising:
    a first DRAM die including a first buffer circuit connected to an external device through external data lines, a first input/output (I/O) circuit connected to the first buffer circuit through first internal data lines, and a first DRAM cell array configured to store data from the first I/O circuit or transmit data stored in the first DRAM cell array to the first I/O circuit;
    a second DRAM die stacked on the first DRAM die, the second DRAM die including a second buffer circuit connected to the first buffer circuit through first memory data lines, a second I/O circuit connected to the second buffer circuit through second internal data lines, and a second DRAM cell array configured to store data from the second I/O circuit or transmit data stored in the second DRAM cell array to the second I/O circuit; and
    a third DRAM die stacked on the second DRAM die, the third DRAM die including a third buffer circuit connected to the second buffer circuit through second memory data lines, a third I/O circuit connected to the third buffer circuit through third internal data lines, and a third DRAM cell array configured to store data from the third I/O circuit or transmit data stored in the third DRAM cell array to the third I/O circuit,
    wherein the first memory data lines are connected to the first and second buffer circuits and not the third buffer circuit, and the second memory data lines are connected to the second and third buffer circuits and not the first buffer circuit,
    wherein the first DRAM die, the second DRAM die, and the third DRAM die are configured to perform a read operation and a write operation in response to first to third chip select signals from the external device, respectively, and
    wherein the second buffer circuit of the second DRAM die is configured to:
    receive write data from the first buffer circuit through the first memory data lines;
    transmit the write data received from the first buffer circuit to the second I/O circuit through the second internal data lines, in response to activation of the second chip select signal; and transmit the write data received from the first buffer circuit to the third buffer circuit through the second memory data lines, in response to deactivation of the second chip select signal.

2. The DRAM package of claim 1, wherein the first buffer circuit of the first DRAM die is configured to:
receive write data from the external device through the external data lines;
transmit the write data received from the external device to the first I/O circuit through the first internal data lines, in response to activation of the first chip select signal; and
transmit the write data received from the external device to the second buffer circuit through the first memory data lines, in response to deactivation of the first chip select signal.

3. The DRAM package of claim 1, wherein the third buffer circuit of the third DRAM die is configured to:
receive write data from the second buffer circuit through the second memory data lines; and
transmit the write data received from the second buffer circuit to the second I/O circuit through the second internal data lines, in response to activation of the second chip select signal.

4. The DRAM package of claim 1, wherein the first buffer circuit is configured to:
in response to activation of the first chip select signal, receive read data from the first I/O circuit through the first internal data lines and transmit the read data received from the first I/O circuit to the external device through the external data lines; and
in response to deactivation of the first chip select signal, receive read data from the second buffer circuit through the first memory data lines and transmit the read data received from the second buffer circuit to the external device through the external data lines.

5. The DRAM package of claim 1, wherein the second buffer circuit is configured to:
in response to activation of the second chip select signal, receive read data from the second I/O circuit and transmit the read data received from the second I/O circuit to the first buffer circuit through the first memory data lines; and
in response to deactivation of the second chip select signal, receive read data from the third buffer circuit through the second memory data lines and transmit the read data received from the third buffer circuit to the first buffer circuit through the first memory data lines.

6. The DRAM package of claim 1, wherein the third buffer circuit is configured to:
in response to activation of the third chip select signal, receive read data from the third I/O circuit through the third internal data lines and transmit the read data received from the third I/O circuit to the second buffer circuit through the second memory data lines.

7. The DRAM package of claim 1, wherein the first DRAM die, the second DRAM die, and the third DRAM die are configured to receive a command and an address from the external device, respectively.

8. The DRAM package of claim 1, wherein the first buffer circuit is configured to receive a command and an address from the external device through signal lines, and transmit the command and the address to the second DRAM die and the third DRAM die.

9. The DRAM package of claim 8, wherein the first DRAM die, the second DRAM die, and the third DRAM die are configured to perform an operation corresponding the received command and the received address, in response to first to third chip select signals, respectively.

10. A dynamic random access memory (DRAM) package comprising:
a first DRAM die including a first buffer circuit configured to receive write data from an external device through external data lines, the first DRAM die configured to perform a first write operation on the write data in response to activation of a first chip select signal, and the first buffer circuit configured to output the write data through first memory data lines in response to deactivation of the first chip select signal;
a second DRAM die including a second buffer circuit configured to receive the write data from the first buffer circuit through the first memory data lines, the second DRAM die configured to be stacked on the first DRAM die and perform a second write operation on the write data in response to activation of a second chip select signal, and the second buffer circuit configured to output the write data through second memory data lines in response to deactivation of the second chip select signal; and
a third DRAM die including a third buffer circuit configured to receive the write data from the second buffer circuit through the second memory data lines, the third DRAM die configured to be stacked on the second DRAM die and perform a third write operation on the write data in response to activation of a third chip select signal,
wherein the first memory dam lines are connected to the first and second buffer circuits and not the third buffer circuit, and the second memory data lines are connected to the second and third buffer circuits and not the first buffer circuit.

11. The DRAM package of claim 10, wherein the first write operation is an operation for storing the write data in one or more first DRAM cells included in the first DRAM die,
the second write operation is an operation for storing the write data in one or more second DRAM cells included in the second DRAM die, and
the third write operation is an operation for storing the write data in one or more third DRAM cells included in the third DRAM die.

12. The DRAM package of claim 11, wherein the first buffer circuit is further configured to receive a write command and an address from the external device and transmit the write command and the address to each of the second DRAM die and the third DRAM die.

13. The DRAM package of claim 12, wherein each of the first to third DRAM cells corresponds to the address.

14. The DRAM package of claim 12, wherein the first DRAM die performs the first write operation in response to the write command received from the external device and the activation of the first chip select signal,
the second DRAM die performs the second write operation in response to the write command received from the first buffer circuit and the activation of the second chip select signal, and
the third DRAM die performs the third write operation in response to the write command received from the first buffer circuit and the activation of the third chip select signal.

15. A dynamic random access memory (DRAM) package comprising:
a first DRAM die configured to perform a first read operation in response to activation of a first chip select signal, the first DRAM die including a first buffer circuit configured to transmit first data or second data to an external device through external data lines, the first data being read by the first read operation, and the second data being received through first memory data lines;

a second DRAM die configured to perform a second read operation in response to activation of a second chip select signal, the second DRAM die including a second buffer circuit configured to transmit third data or fourth data to the first buffer circuit through the first memory data lines as the second data, the third data being read by the second read operation, and the fourth data being received through second memory data lines; and a third DRAM die configured to perform a third read operation in response to activation of a third chip select signal, the third DRAM die including a third buffer circuit configured to transmit fifth data read by the third read operation to the second buffer circuit through the second memory data lines as the fourth data, wherein the first memory data lines are connected to the first and second buffer circuits and not the third buffer circuit, and the second memory data lines are connected to the second and third buffer circuits and not the first buffer circuit.

16. The DRAM package of claim 15, wherein the first buffer circuit is further configured to receive a read command and an address from the external device through signal lines, and transmit the read command and the address to each of the second DRAM die and the third DRAM die.

17. The DRAM package of claim 16, wherein the first DRAM die performs the first read operation on one or more first DRAM cells included in the first DRAM die in response to the read command received from the external device and the activation of the first chip select signal, wherein the second DRAM die performs the second read operation on one or more second DRAM cells included in the second DRAM die in response to the read command received from the first buffer circuit and the activation of the second chip select signal, and wherein the third DRAM die performs the third read operation on one or more third memory cell included in the third DRAM die in response to the read command received from the first buffer circuit and the activation of the third chip select signal.

18. The DRAM package of claim 17, wherein each of the one or more first DRAM cells, one or more second DRAM cells, and one or more third DRAM cells corresponds to the address.

* * * * *